US006510086B2

(12) United States Patent
Kato et al.

(10) Patent No.: US 6,510,086 B2
(45) Date of Patent: *Jan. 21, 2003

(54) NONVOLATILE SEMICONDUCTOR MEMORY

(75) Inventors: Masataka Kato, Musashino (JP); Tetsuo Adachi, Hachioji (JP); Toshihiro Tanaka, Akigawa (JP); Toshio Sasaki, Tokyo (JP); Hitoshi Kume, Musashino (JP); Katsutaka Kimura, Akishima (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/984,918

(22) Filed: Oct. 31, 2001

(65) Prior Publication Data

US 2002/0024849 A1 Feb. 28, 2002

Related U.S. Application Data

(63) Continuation of application No. 09/881,020, filed on Jun. 15, 2001, which is a continuation of application No. 09/630,426, filed on Aug. 1, 2000, now Pat. No. 6,272,042, which is a continuation of application No. 09/288,313, filed on Apr. 8, 1999, now Pat. No. 6,101,123, which is a continuation of application No. 09/124,794, filed on Jul. 30, 1998, now Pat. No. 5,910,913, which is a division of application No. 08/739,156, filed on Oct. 30, 1996, now Pat. No. 5,828,600, which is a division of application No. 08/164,780, filed on Dec. 10, 1993, now Pat. No. 5,592,415, which is a continuation-in-part of application No. 08/085,156, filed on Jul. 2, 1993, now abandoned.

(30) Foreign Application Priority Data

Jul. 6, 1992 (JP) .............................................. 4-177973

(51) Int. Cl.$^7$ ................................................ G11C 16/04
(52) U.S. Cl. ............................. 365/185.29; 365/185.11; 365/185.23

(58) Field of Search ...................... 365/185.11, 185.29, 365/185.33

(56) References Cited

U.S. PATENT DOCUMENTS

| 4,924,437 A | 5/1990 | Paterson et al. ............. 365/185 |
| 4,953,129 A | 8/1990 | Kobayashi et al. .......... 365/203 |
| 5,053,648 A | 10/1991 | van den Elshout et al. . 307/469 |

(List continued on next page.)

FOREIGN PATENT DOCUMENTS

| JP | 62-276878 | 12/1987 |
| JP | 01-229497 | 9/1989 |
| JP | 03-219496 | 9/1991 |
| JP | 04-014871 | 1/1992 |

OTHER PUBLICATIONS

IEEE Journal of Solid State Circuits, vol. 26, No. 4, Apr. 199, pp. 484–491.
IEEE Journal of Solid State Circuits, vol. SC–17, No. 5, Oct. 1982, pp. 821–827.

(List continued on next page.)

Primary Examiner—Vu A. Le
(74) Attorney, Agent, or Firm—Antonelli, Terry, Stout & Kraus, LLP

(57) ABSTRACT

Disclosed is a nonvolatile memory system including at least one nonvolatile memory each having a plurality of nonvolatile memory cells and a buffer memory; and a control device coupled to the nonvolatile memory. The control device is enabled to receive external data and to store the data in the nonvolatile memory, and the nonvolatile memory is capable of performing at least a program operation and an erase operation. Moreover, the control device is enabled to receive external data while the nonvolatile memory is operating in the erase operation. Also, the buffer memory is capable of receiving a unit of data, in the program operation, equal to the data length of data to be stored at one time of the program operation, the data length being more than 1 byte.

22 Claims, 21 Drawing Sheets

U.S. PATENT DOCUMENTS

| | | | |
|---|---|---|---|
| 5,060,195 A | 10/1991 | Gill et al. | 365/185 |
| 5,168,335 A | 12/1992 | D'Arrigo et al. | 357/23.5 |
| 5,222,040 A | 6/1993 | Challa | 365/185 |
| 5,249,158 A * | 9/1993 | Kynett et al. | 365/230.03 |
| 5,280,454 A | 1/1994 | Tanaka et al. | 365/218 |
| 5,297,103 A | 3/1994 | Higuchi | |
| 5,347,490 A | 9/1994 | Terada et al. | 365/219 |
| 5,363,330 A | 11/1994 | Kobayashi et al. | 365/185 |
| 5,392,253 A | 2/1995 | Atsumi et al. | 365/230.06 |
| 5,396,459 A | 3/1995 | Arakawa | 365/185 |
| 5,530,828 A | 6/1996 | Kaki et al. | 395/430 |
| 5,663,901 A | 9/1997 | Wallace et al. | 365/52 |
| 5,828,600 A | 10/1998 | Kato et al. | 365/185.11 |
| 6,201,735 B1 | 3/2001 | Kato et al. | 365/185.11 |

OTHER PUBLICATIONS

Kume et al., H., "A 1.28 $\mu m^2$ Contactless Memory Cell Technology for a 3–V Only 64 Mbit EEPROM", *International Electron Devices Meeting, 1992, Technical Digest*, pp. 24.7.1–24.7.3.

Nakayama et al., T., "A 60ns 16Mb Flash EEPROM with Program and Erase Sequence Controller", *1991 IEEE ISSCC*, pp. 260–261.

* cited by examiner

FIG. 18

TABLE 1

|  | W11 | W12 | W1n | D1 | D2 | Dm | SD1 | SS1 | COMMON SOURCE |
|---|---|---|---|---|---|---|---|---|---|
| ERASE | 0 | 12 | 0 | 0 | 0 | 0 | 3.3 | 3.3(0) | 0 |
| PROGRAM | 3.3 | -7 | 3.3 | 0/3.3 | 0/3.3 | 0/3.3 | 3.3~5 | 0 | 0 |
| READ | 0 | 3.3 | 0 | - | - | - | 3.3 | 3.3 | 0 |

|  | W21 | W22 | W2n | SD2 | SS2 | SUB-STRATE |
|---|---|---|---|---|---|---|
| ERASE | 0 | 0 | 0 | 0 | 0 | 0 |
| PROGRAM | 0 | 0 | 0 | 0 | 0 | 0 |
| READ | 0 | 0 | 0 | 0 | 0 | 0 |

FIG. 19

TABLE 2

|  | W11 | W12 | W1n | D1 | D2 | Dm | SD1 | COMMON SOURCE | SUB-STRATE |
|---|---|---|---|---|---|---|---|---|---|
| ERASE | 0 | 12 | 0 | 0 | 0 | 0 | 3.3 | 0 | 0 |
| PROGRAM | 3.3 | -7 | 3.3 | 0/3.3 | 0/3.3 | 0/3.3 | 3.3~5 | 0 | 0 |
| READ | 0 | 3.3 | 0 | - | - | - | 3.3 | 0 | 0 |

NONVOLATILE SEMICONDUCTOR MEMORY

This application is a continuation of application Ser. No. 09/881,020, filed Jun. 15, 2001; which is a continuation of Ser. No. 09/630,426, filed Aug. 1, 2000, now U.S. Pat. No. 6,272,042; which was a continuation of application Ser. No. 09/288,313, filed Apr. 8, 1999, now U.S. Pat. No. 6,101,123; which was a continuation of Ser. No. 09/124,794, filed Jul. 30, 1998, now U.S. Pat. No. 5,910,913; which was a divisional of application Ser. No. 08/739,156, filed Oct. 30, 1996, now U.S. Pat. No. 5,828,600; which was a divisional of application Ser. No. 08/164,780, filed Dec. 10, 1993, now U.S. Pat. No. 5,592,415; and which, in turn, was a continuation-in-part of application Ser. No. 08/085,156, filed Jul. 2, 1993, now abandoned; and the entire disclosures of all of which are incorporated herein by reference.

BACKGROUND OF THE INVENTION

1. Field of the Invention

This invention relates to a nonvolatile semiconductor memory having an electric programmable/erasable function.

2. Description of the Related Art

A memory referred to as an "electric one-time erasable NOR type flash memory" has been developed in the past as a nonvolatile semiconductor memory as described, for example, in JP-A-62-27687 (laid open on Dec. 1, 1987) and JP-A-3-219496 (laid open on Sep. 26, 1991).

FIG. 7 of the accompanying drawings illustrates a schematic sectional structure of the NOR type flash memory cell according to the prior art and its operation. The NOR type flash memory cell according to the prior art comprises a floating gate type field effect transistor structure wherein a gate oxide film 2, a floating gate 3, an intermediate insulating film 4 and a control gate 5 are formed on a p type silicon substrate 1, an n type impurity layer 22 is formed on a source terminal side and an n type impurity layer 23 and a p type impurity layer 24 are formed on a drain terminal side.

The NOR type flash memory according to the prior art is formed by arranging the memory cells described above in matrix, connecting the drain terminal of each memory cell to a data line, connecting each source terminal to a common source line, and connecting each control gate to a word line.

Memory cell data is erased by applying a negative voltage to the control gate 5 and a positive voltage to the source impurity layer 22. At this time, a high electric field is applied to the gate oxide film 2 and a tunnelling mechanism of electrons takes place, so that electrons accumulated in the floating gate 3 are pulled out to the source impurity layer 22. A threshold voltage of the memory cell decreases due to this erasing operation.

Programming of data into the memory cell is effected by applying a positive voltage to the drain impurity layer 23 and to the control gate 5. At this time, hot electrons generated in the vicinity of the surface of a drain junction are injected into the floating gate 3. A threshold voltage of the memory cell increases due to this programming.

The NOR type flash memory according to the prior art described above have the function of collectively erasing at one time a chip as a whole or a certain groups of memory cells, and one transistor can constitute one memory cell. Further, when a circuit scheme wherein a source wiring is used in common for all bits, is employed, the memory chip area can be reduced.

In comparison with the NOR type flash memory cell according to the prior art described above, a nonvolatile semiconductor memory is known which utilizes a Fowler-Nordheim (F-N) tunneling mechanism.

An ACEE (Advanced Contactless EEPROM) described in IFEE Journal of Solid-State Circuits, Vol 4, No 4, April. 1991, pp 484–491, is one of the examples of the non-volatile semiconductor memory described above. Transistors used for this ACEE are those transistors which have a thin oxide film region for the F-N tunneling at only an overlapped portion between the floating gate and the source, and the thickness of the oxide film of the transistor region is set to be greater than the thickness of the oxide film in the tunnel region. The memory cells are arranged in matrix, the drain terminal of each memory cell is connected to a data line comprising an impurity layer, and the source terminal is connected to a source line comprising mutually different impurity layers. Further, the impurity layer data line and the impurity layer source lines connected to a plurality of memory cells are connected to a data line and to a common source line through a MOS transistor (select transistor), respectively.

The device operations are as follows. In the erasing operation, a negative voltage (−11 V) is applied to a selected control gate to turn ON a source side select transistor and a positive voltage (5 V) is applied to the common source terminal, so that electrons are released from the floating gate through the tunnel region on the source side of the selected memory cell In the programming operation, the drain side select transistor is turned ON with the source side select transistor being kept OFF, a positive voltage (18 V) is applied to the selected control gate, a positive voltage (7 V) is applied to the non-selected control gate to such an extent that programming is not made, 0 V is applied to the data line so as to set the voltage on the source side to 0 V through the non-selected memory cells which commonly share the data line but to which programming is not made, and the electrons are thus injected into the floating gate from the source side tunnel region of the selected memory cell by utilizing the F-N tunneling mechanism. Here, a 7 V voltage is applied to the data line for those memory cells which share in common the control gate voltage with the memory cell to be subjected to programming but into which programming is not made, and the electric field applied to the source side tunnel region is relaxed.

Since the ACEE utilizes the F-N tunneling mechanism for the programming/erasing operations, a consumed current per bit is small and hence, a voltage booster having small current drivability can be used inside the chip. Accordingly, a single 5 V supply can be used.

A nonvolatile semiconductor memory utilizing the F-N tunneling mechanism is also described in JP-A-4-14871 (laid open on Jan. 20, 1992). This nonvolatile semiconductor memory uses a floating gate type field effect transistor structure for memory cells, and has the structure wherein the drains of a predetermined number of memory cells are connected by a sub bit line, this sub bit line is connected to a main bit line through a MOS transistor, and the source terminals are connected in common to the source line.

To erase memory cell data, a positive voltage $V_p$ (e.g. 22 V) is applied to the control gate, and the source terminals and the drain terminals are first grounded so as to accumulate the electrons in the floating gate. In the programming operation, the control gate of a selected memory cell is grounded and the positive voltage $V_p$ is applied to the drain impurity layer. To inhibit programming, a voltage $V_p/2$ is applied to the drain terminals. Accordingly, the electrons are released from the floating gate to the drain impurity layer in the select memory cell due to the tunneling mechanism.

The non-volatile semiconductor memory using the F-N tunneling mechanism effects the programming/erasing operations of data by the use of a very small current, that is, the tunnel current. Accordingly, this semiconductor memory is effective for accomplishing lower power consumption.

An EEPROM described in IEEE Journal of Solid-State Circuits, Vol. SC-17, No. 5, October 1982, pp. 821–827, is another example of the nonvolatile semiconductor memory using the F-N tunneling mechanism. In this EEPROM, the electrons are injected from the drain to the floating gate and attain a low threshold voltage in the programming operation, and the electrons are released from the floating gate to the whole channel immediately therebelow and attain a high threshold value. The cell of this EEPROM comprises a floating gate type F-N tunnel transistor and a selector transistor connected to the drain side of the former. The memory cells are arranged in matrix, the drain terminal of the select transistor of the memory cell is connected to the data line through a switch transistor outside the memory cell, and the source terminal of the floating gate type F-N tunnel transistor of the memory cell is directly connected to the common source line.

SUMMARY OF THE INVENTION

However, in the NOR type flash memory cell shown in FIG. 7, the consumed current at the time of programming is great, although the memory cell structure is miniature, and a single power supply operation is difficult. In other words, since the data programming operation to the floating gate relies on the hot carrier injection system, a current of about 500 $\mu$A per bit must be supplied as a drain current, for a drain current of higher than 3.3 V, for example. Further, in the case of a single 3 V supply, an operation at a minimum power source voltage of 2.7 V must be insured. Therefore, a drain terminal voltage condition for programming cannot be satisfied. Furthermore, even when a 3.3 V stabilized power source is produced by the use of a voltage booster inside a chip, the increase of the area of the voltage booster necessary for supplying a large current for the hot carriers becomes essentially necessary, and this renders an obstacle for reducing the chip area.

In contrast, the nonvolatile semiconductor memory utilizing the F-N tunneling mechanism is effective for reducing power consumption because the program/erase operation of the data is effected using a very small current of the tunnel current.

However, the cell of the EEPROM comprising the floating gate type F-N tunnel transistor and the select transistor according to the prior art involves the problem that the cell area is great. Moreover, the inventors of the present invention have clarified, as a result of studies, the problems that the flow threshold voltage of the floating gate type F-N tunnel transistor assumes a negative value due to the circuit scheme of the memory cell and that a large drain current flows through the memory cell at the time of the programming operation because a switch transistor is not interposed between the source terminal of the floating gate type F-N tunnel transistor of the memory cell and the common source line.

The ACEE according to the prior art described above has the impurity layer wiring structure which can reduce the number of contact holes per bit of the memory cell, and reduces the memory array area. However, the memory cell itself substantially requires two regions, that is, the transistor region and the exclusive tunnel oxide film region for generating the F-N tunneling mechanism, and the increase of the memory cell area is unavoidable.

Now, let's consider the case where the floating gate type field effect transistor structure described in JP-A-4-14871 is applied to the ACEE circuit scheme in order to avoid the increase of the memory cell area. In this case, according to the circuit operation of the ACEE of the prior art described above, the control gate selected at the time of programming of the data into the memory cell is set to 18 V and the data line to 0 V. Accordingly, the memory cell is under the inversed state, and the electrons are injected into the floating gate through the whole channel. Accordingly, it has been found out that the data write time becomes longer than when a transistor having an original exclusive tunnel region is used.

In the circuit operation of the ACEE according to the prior art described above, a 7 V voltage is applied to the data line to inhibit programming and the source line is charged through the non-selected memory cells. However, since the charge current of the source line flows from the drain terminal of the non-selected memory cell to the source terminal, injection of the hot electrons into the floating gate is more likely to occur, so that programming of electrons into the non-selected memory cells takes place This phenomenon is referred to as "disturbance". It has been found out that this disturbance invites the rise of the threshold voltage in the non-selected memory cells.

It has been found out further that when the floating gate type field effect transistor structure is applied to the ACEE, variance of the threshold voltage (low threshold voltage) at the time of erasing must be restricted. In the erasing operation, the positive voltage is applied to the source terminal and the negative voltage to the control gate, so that the electrons can be pulled out from the floating gate to the source impurity layer by the tunneling mechanism. Since the source impurity layer region serves as the tunnel region, any variance of the formation process of the source impurity layer results in variance of the tunnel current. This variance of the tunnel current is greater than variance occurring in the structure where the tunnel region is exclusively disposed. As a result, when the memory cells existing on the same word line are erased at one time, variance of the tunnel current invites variance of the erase time. Accordingly, the erase voltage is excessively applied to the memory cell which is erased at the earliest timing and its threshold voltage is likely to become negative. The greater the scale of the memory array, the greater becomes variance of the formation process of the source impurity layer as the cause of this phenomenon. Accordingly, it has been found out that a large scale memory cell is difficult to attain As described above, the inventors of the present invention have clarified that though the circuit scheme of the ACEE is effective, there still remain the problems of programming characteristics, disturbance characteristics and expansion of the scale of the memory array when the ACEE is accomplished by the mere use of the floating gate type field effect transistor structure.

Further, when the nonvolatile semiconductor memory described in JP-A-4-14871 is examined, the following problems are found out to increase the memory array scale, though this device has the possibility of a higher integration density and a higher readout speed.

(1) To promote miniaturization, this memory employs a sub bit line structure using a silicide or a refractory metal, but one contact region per two bits must be disposed. Accordingly, the memory cell area must still be reduced effectively.

(2) The erasing operation is effected by applying the positive voltage $V_p$ to the control gate and grounding the source and drain terminals, and the programming operation is effected by grounding the control gate and applying the positive voltage $V_p$ to the drain impurity layer. Accordingly, degradation of the tunnel oxide film in the vicinity of the source region is remarkable and current drivability β of the memory cell drastically drops. More specifically, when the programming operation is carried out by grounding the control gate and applying the positive voltage $V_p$ to the drain diffusion layer, holes of the electron-hole pairs occurring at the drain terminal are injected into the gate oxide film in accordance with the direction of the electric field when the number of times of program/erase is small, the injection quantity of the holes is small, and degradation occurs only at the drain terminal and does not invite the drop β of the memory cell. As the number of times for program/erase increases, the injection quantity of the holes becomes greater and drain expands from the drain terminal to portions in the vicinity of the source. For this reason, it becomes difficult to guarantee the number of times of program/erase of at least $10^6$ which is required for a large capacity file memory.

It is therefore an object of the present invention to provide a nonvolatile semiconductor memory having low power consumption, capable of a high speed operation and having an effectively reduced cell area in a nonvolatile semiconductor memory having an electric programmable/erasable function.

It is another object of the present invention to provide a non-volatile semiconductor memory ensuring the number of times of program/erase of at least $10^6$ and optimal for a large scale memory array in both aspects of programming characteristics and disturbance characteristics.

The objects described above can be accomplished by a nonvolatile semiconductor memory having an electric programmable/erasable function, as typified by a preferred embodiment of the present invention shown in FIG. 1, for example, which comprises memory arrays each comprising a plurality of memory cells disposed in matrix having rows and columns, wherein each memory cell comprises one MOSFET including a source region 6 and a drain region 7 disposed on a semiconductor substrate in a mutually spaced-apart relationship, a floating gate electrode 3 formed through a gate insulating film 2 having a uniform film thickness from the surface of the source region to the surface of the drain region 7 and a control gate 5 formed on the floating gate electrode 3 through an intermediate insulating film 4, wherein the drain regions of a plurality of memory cells on the same column are connected to a data line formed for each column and the control gates of the memory cells on the same row are connected to a word line formed for each row, wherein a voltage having a first polarity with respect to the semiconductor substrate 1 is applied to the drain region 7 of the memory cell which is an object of a programming operation and a voltage having a second polarity different from the first polarity with respect to the semiconductor substrate 1 is applied to the control gate 5 of the memory cell when the programming operation is effected, so as to set the source region 6 of the memory cell to the same potential as the potential of the substrate, and wherein a voltage having the first polarity with respect to the semiconductor substrate 1 is applied to the control gates 5 of a plurality of memory cells to be subjected to an erasing operation and all the other electrodes and the semiconductor substrate 1 are kept at the same potential when the erasing operation is effected.

In this way, the present invention accomplishes low power consumption by the program/erase system utilizing the tunneling mechanism. On the other hand, miniaturization of the memory cell area can be accomplished by the memory cell structure shown in FIG. 1.

In the erasing operation, the voltage having the first polarity is applied to the control gate 5 and the source region 6 and the drain region 7 are brought to the same potential as that of the substrate. Accordingly, the F-N tunneling develops through the gate oxide film 2, and the electrons are charged into the floating gate 3 from the whole channel of the memory cell. In consequence, the threshold voltage of the memory cells on the same row is raised. A plurality of memory cells having the control gates thereof connected to a plurality of word lines can be collectively erased by selecting at one time a plurality of word lines. Unlike the programming operation of the ACEE described above, this erasing operation does not charge the source line through the memory cells, into which programming is not made, by applying the voltage having the first polarity to the data line. Therefore, the problem of degradation of the hot carriers due to the charge current, etc., of the source line does not occur.

In the programming operation, the voltage having the second polarity is applied to the control gate 5 while the voltage having the first polarity is applied to the drain region 7, and the source region 6 is brought to the same potential as the substrate potential.

Accordingly, the F-N tunneling develops through the gate oxide film 2 and the electrons are released from the floating gate 3 to the drain diffusion layer side using an overlapped portion (hereinafter after referred to as the "drain diffusion layer edge region") between the drain diffusion layer 7 and the floating gate 3, so that the threshold voltage of the memory cells becomes low. The programming operation is effected in the word line unit, the voltage of the data line connected to the memory cell to be subjected to programming is set to the voltage having the first polarity, and the voltage of the data line connected to the memory cells, for which programming is not made, is brought to the same potential as the substrate potential. In this way, programming can be made to desired memory cells.

In the readout operation, the selected word line is set to the voltage having the first polarity while the non-selected word lines are kept at the same potential as the substrate potential. The memory cell for which programming is made is turned ON and a current flows, but the memory cells for which programming is not made are turned OFF and no current flows. Accordingly, the ON/OFF state of the memory cells can be obtained by observing the current or the voltage flowing through the data line by the use of a sense amplifier connected to the data line.

BRIEF DESCRIPTION OF THE DRAWINGS

FIG. 18 is a table showing a voltage relationship of signal lines in each of the data erasing, programming and read-out operations in the first embodiment of the present invention.

FIG. 19 is a table similar to FIG. 18 in the second embodiment of the present invention.

DESCRIPTION OF THE PREFERRED EMBODIMENTS

The first embodiment of the present invention will be described with reference to FIGS. 1 to 6.

Figure 1:
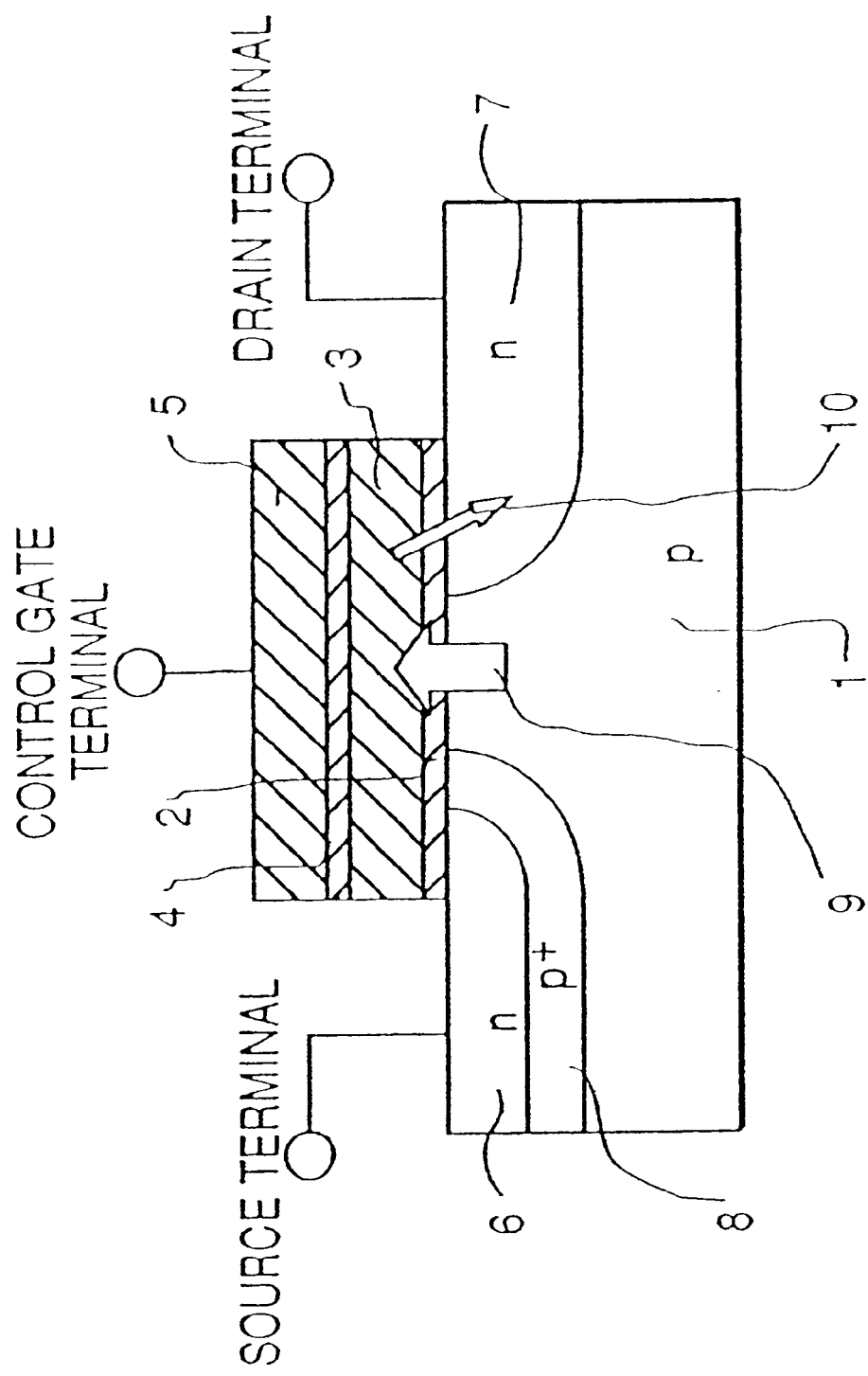
FIG. 1 is a sectional view showing, in simplification, the sectional structure of a memory cell used for a nonvolatile semiconductor memory according to the present invention.
Figure 2:
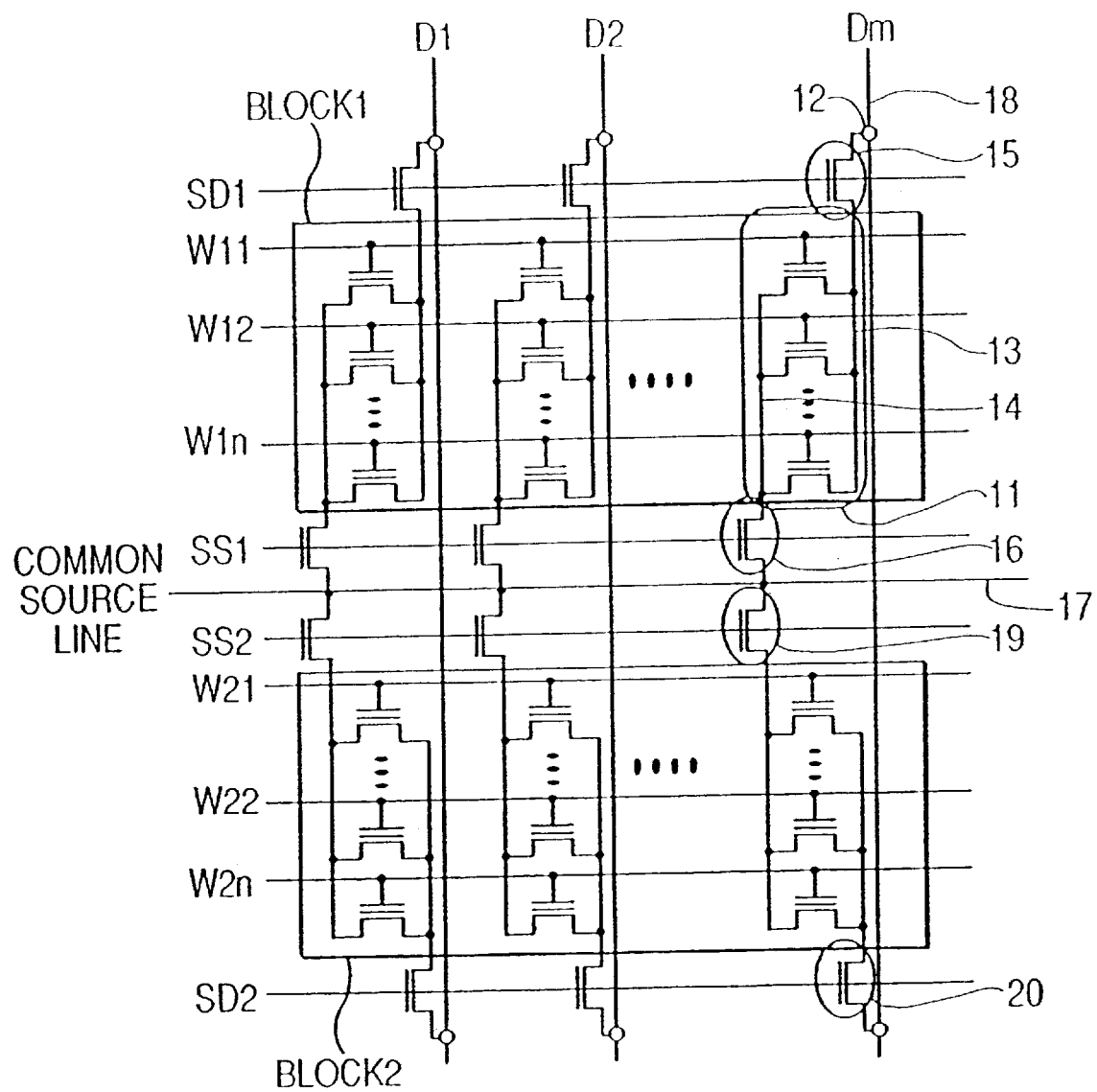
FIG. 2 is a circuit diagram showing the circuit scheme according to the first embodiment of the present invention
Figure 3:
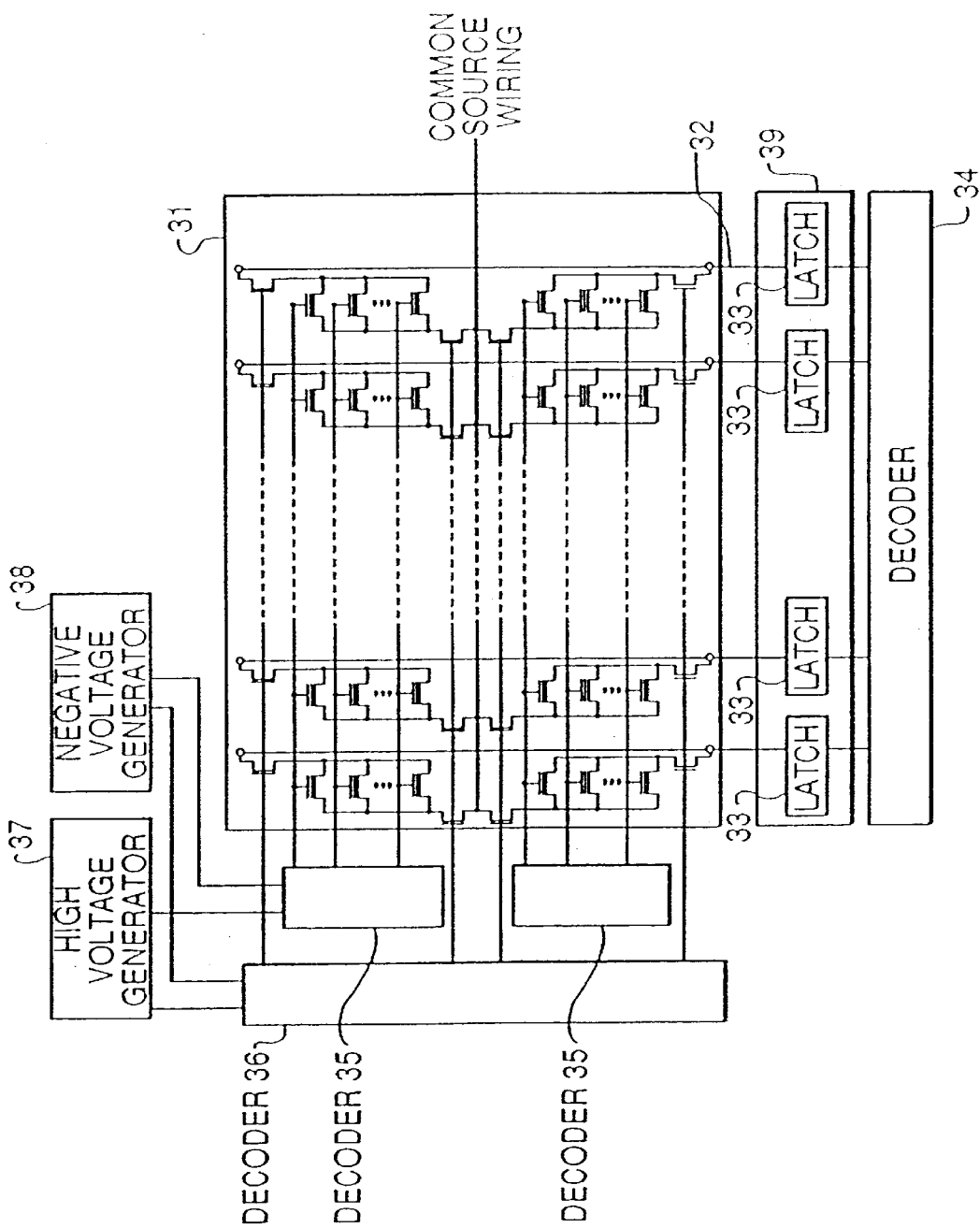
FIG. 3 is a block diagram of the nonvolatile semiconductor memory according to the first embodiment of the present invention.
Figure 4:
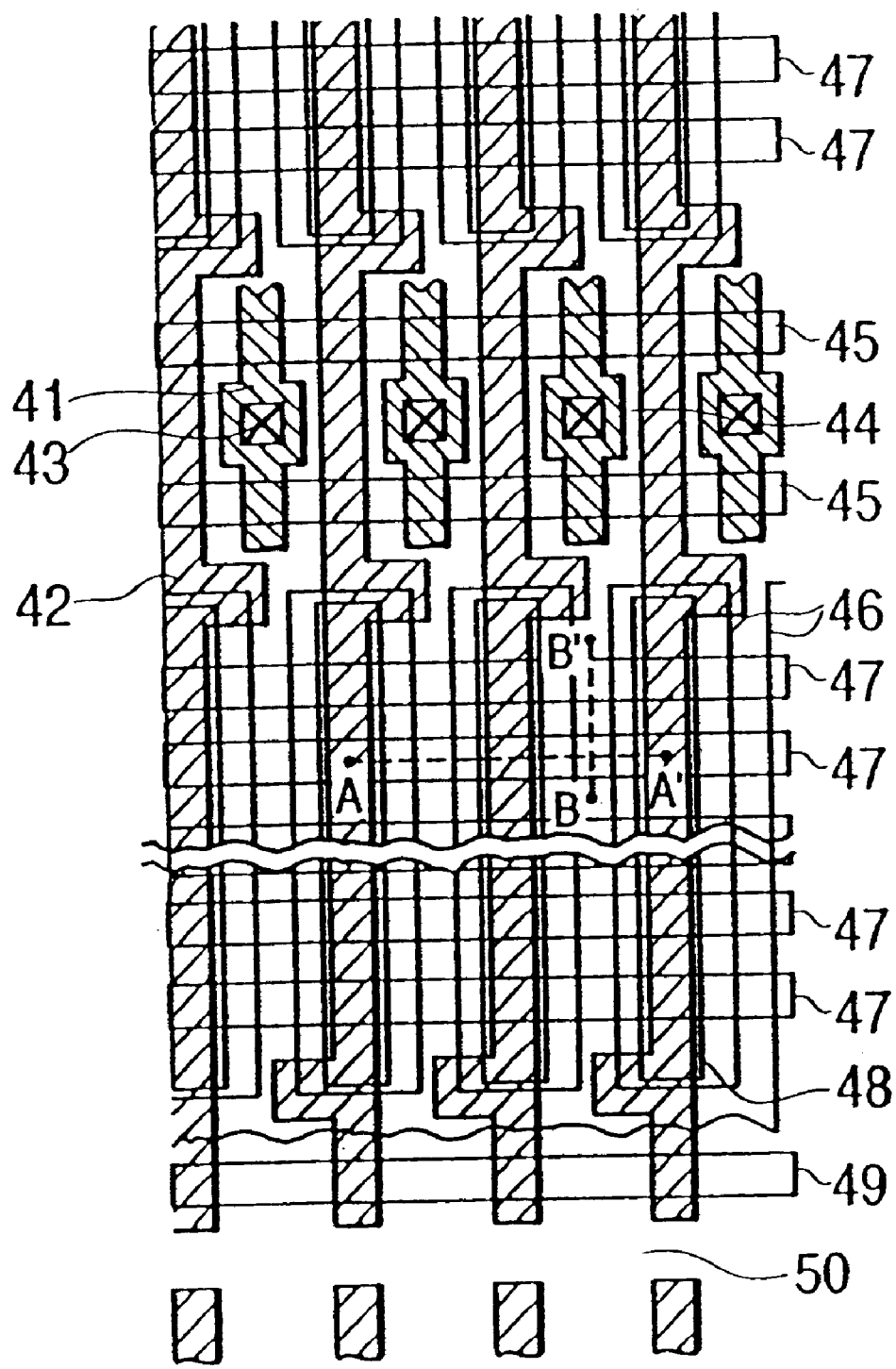
FIG. 4 is a plan view showing the memory cell structure of the nonvolatile semiconductor memory according to the first embodiment of the present invention.
Figure 5:
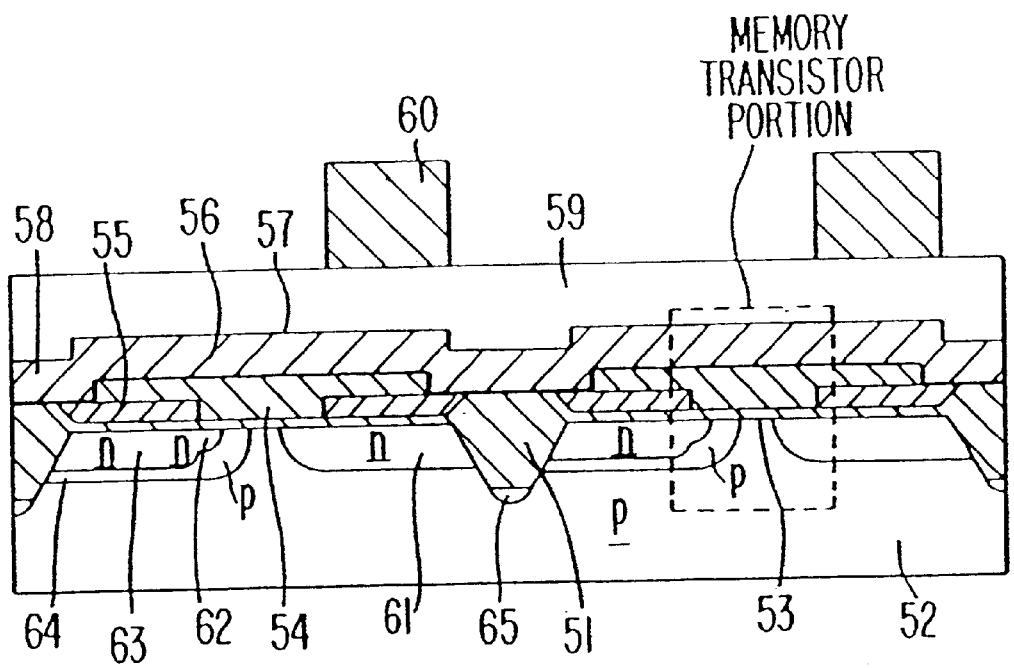
FIG. 5 is a sectional view showing a memory cell shape when taken along a line A–A' of FIG. 4.
Figure 6:
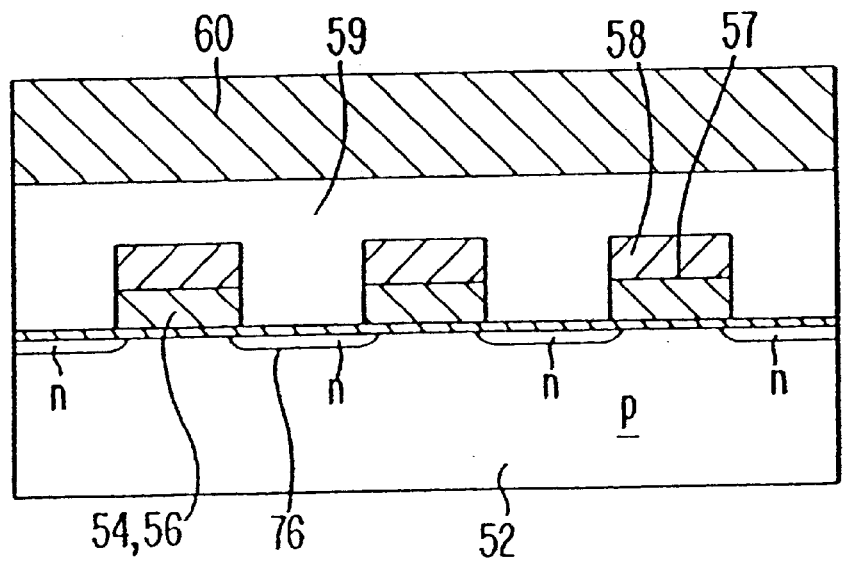
FIG. 6 is a sectional view showing the memory cell shape when taken along a line B–B' of FIG. 4.
Figure 7:
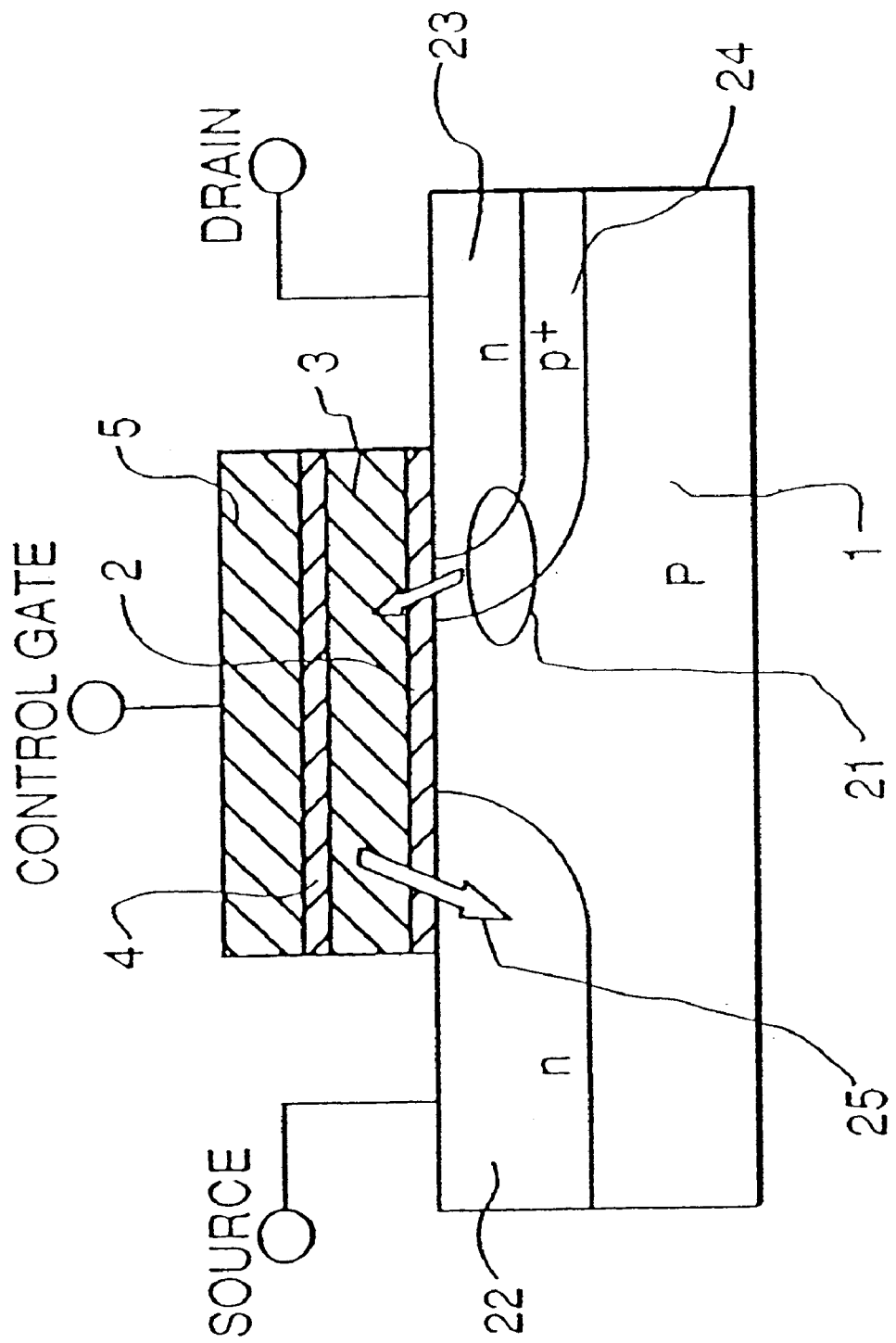
FIG. 7 is a sectional view showing the structure of an NOR type flash memory according to the prior art.

FIG. 1 shows a device structure (a transistor structure) of a memory cell, FIG. 2 shows a circuit scheme, FIG. 3 is a block diagram of a nonvolatile semiconductor memory, FIG. 4 is a plan view of the memory cell structure, FIG. 5 is a sectional view taken along a line A–A' of FIG. 4, and FIG. 6 is a sectional view taken along a line B–B' of FIG. 4.

FIG. 1 shows in a simplified form a transistor in the region encompassed by a dash line in FIG. 5 so as to explain the operation of a memory cell according to the present invention. Since the structure shown in FIG. 5 is used in practice, the memory cell structure will be explained with reference to FIG. 5. The drawing shows a memory cell for 2 bits, having the same word line. A gate insulating film 53 having a uniform film thickness of about 7 nm is formed on a p type semiconductor substrate 52. A first floating gate electrode 54 is formed on a gate oxide film 53, and an insulating film 55 is formed on the side surface of the first floating gate electrode 54. A second floating gate electrode 56, which is electrically connected to the first floating gate electrode, is formed next. A control gate 58 functioning as a word line is formed on the second floating gate electrode 56 through an intermediate insulating film 57. An about 15 nm thick insulating film, as calculated by a silicon dioxide film, is used for the intermediate insulating film. The second floating gate electrode 56 is so designed as to possess a greater area than the first floating gate electrode 54. In this way, a capacitance between the second floating gate 56 and the control gate 58 is increased. Incidentally, the first floating gate electrode 54 is patterned into a gate length of the memory cell. An n type source region 62 and drain region 61 are formed in self-alignment with the first floating gate electrode 54. A p type diffusion region 64 is formed in the source region 62 to a greater depth than the n type impurity diffusion layer forming the source region 62, and an n type impurity region 63 for diffusion layer wiring of the source region is formed The p type diffusion layer region 64 functions also as a punch-through stopper which is required at a gate length of the memory cell of below 0.4 microns, and is used for regulating the threshold voltage of the memory cell under a thermal equilibrium condition. To tunnel-release electrons using an overlapped portion between the drain region 61 and the floating gate 54 (a drain diffusion layer edge), the impurity concentration of the n type impurity diffusion layer 61 constituting the drain region 61 is set to be higher than the impurity concentration of the n type impurity diffusion layer constituting the source region 62. For example, the drain region is formed by ion implantation of arsenic and its surface concentration is set to be at least $10^{20}/cm^3$.

FIG. 2 shows the basic circuit of two blocks using n word lines (e.g., n=16 to 128) as a unit. Here, n memory cells constitute one group 11, and memory cells corresponding to m data lines are connected to one word line. Therefore, m×n memory cells function as one block. To establish connection between the data lines and the memory cells, a contact hole region 12 is defined for each group and is connected to the data lines. In other words, the memory cells are connected in parallel, and the drain and source terminals of these memory cells are connected by a drain diffusion layer wiring 13 formed by an n type impurity region, as a first common wiring, and by a source diffusion layer wiring 14 as the second common wiring. Each data line 18 is wired by a metal having a low resistance value, and is connected to the drain diffusion layer wiring (sub data line) 13 inside the block through lines of select transistors 15, 20 comprising an n type MOS transistor (or insulated-gate field-effect transistor). The drain terminal of each of the n memory cells is connected to the drain diffusion layer wiring 13 and its source terminal, to the source diffusion layer wiring (sub source line) 14. Here, the resistance value of the drain and source diffusion layer wirings is from 50 to 500 Ω/□, for example. The source diffusion layer wiring 14 is connected to the common source wiring 17 through select transistors 16, 19 comprising an n type MOS transistor (or insulated-gate field-effect transistor).

The number m of data lines to be connected to one word line is, for example, some multiples of 512. For, in view of the alternative application of fixed memory devices at present, handling of one input/output (I/O) device becomes easier when the number of data lines is some multiples of 512. The number n of the word lines greatly depends on the electrical characteristics of the constituent memory cells and the resistance value of the diffusion layer wiring. When the number of the word lines connected to the data lines is 8,192, for example, 8,192/n×2 select transistors become necessary. Therefore, the greater the number n, the smaller becomes the occupying area of the select transistors. However, when n becomes great, the resistance value of the diffusion layer cannot be neglected, and the read-out characteristics of the memory cell are lowered. Here, n of 32 to 256 is used.

Reduction of the chip area can be promoted by arranging the memory cells in the array form as shown in FIG. 2.

The block structure of the nonvolatile semiconductor memory chip will be explained with reference to FIG. 3. A latch circuit 33 for holding data is connected to the memory array portion 31 shown in FIG. 2 and to each data line 32 connected to the memory array. Each latch circuit 33 is then connected to a common data line through a decoder 34. The common data line is connected to an input/output circuit. Further, an external input power source terminal having a single voltage level is disposed on the same substrate, though not shown in the drawing. Incidentally, the latch circuit, the decoder, the common data line and the input/output circuit can be disposed for the other memory arrays formed in the same chip.

A drive line of a select transistor for selecting the word line and the block connected to each memory block is connected to each decoder 35, 36. A high voltage generator (voltage booster) 37 and a negative voltage generator 38 are connected to the decoders 35, 36. According to this structure, a high voltage is selectively applied from the voltage booster 3 to the selected word line at the time of erase, and a negative voltage is selectively applied from a negative voltage generator 38 to the selected word line at the time of programming.

The voltage booster 37 and the negative voltage generator 38 comprise a charge pump type voltage converter, for example, and can generate a high voltage and a negative voltage from a single power supply voltage of not higher than 3.3 V.

Next, the voltage relationship of the signal lines in each of the data erasing, programming and read-out operations in this embodiment will be explained with reference to Table 1 in FIG. 18. Table 1 tabulates an example of the erasing, programming and read-out operations for the word line W12. The term "erase state" means herein the state where the threshold voltage of the memory cell is under a high state of at least 3.3 V, for example, and the term "programming state" means a state where the threshold voltage is within the range of 0.5 to 15 V, for example.

First of all, to effect the erase operation, the block 1 containing W12 must be activated. Here, SD1 and SS1 are set to 3.3 V so as to turn ON at least one of the select transistors 15 and 16. At this time, the voltage of the signal lines SD2 and SS2 of the other block is 0 V. A voltage of 12 V is applied to W12 of the word line in the selected block, and all the other word lines are set to 0 V. Since all the data lines are set to 0 V at this time, a voltage of 6 to 8 V as a capacitance division voltage of a control gate voltage and a channel voltage is applied to the floating gates of all the memory cells connected to the word line W12.

Accordingly, a high electric field is applied to the gate oxide film between the floating gates and the channel region, an F-N tunnel current flows and electrons are Injected to the floating gates, so that the threshold voltage of the memory cell can be brought to about 3.3 V. The time necessary for erasing is about 1 millisecond. Since the memory cells on the other word lines are not erased, only the memory cell on one word line can be erased, and erase in a 512-byte unit (sector erase), for example, can be made. Simultaneous erase of multiple sectors is also possible by selecting simultaneously a plurality of word lines.

To execute programming, the data is first transferred from the input/output circuit to the latch circuit 33 (included in the sense/latch circuit 39 in FIG. 3) disposed for each data line. Next, to activate the block 1 containing the word line W12, the signal line SD1 is set to a voltage of not lower than 3.3 V. At this time, SS1 is set to 0 V, and the source line in the block is electrically isolated from the common source line. The signal lines SD2 and SS2 of the non-selected block are set to 0 V, and the non-selected block is cut off from the data line. A voltage of −7 V is applied to the word line W12 inside the selected block, and all the other word lines are set to 3.3 V as the power source voltage, for example. A voltage of 0 V or 3.3 V, for example, is applied to the diffusion layer wirings inside the block in accordance with the data of the latch circuit connected to each data line. When the voltage of the drain terminal of the memory cell is 3.3 V, a high electric field is applied to the gate oxide film between the drain diffusion layer and the floating gate, the electrons inside the floating gate are pulled out to the drain terminal, and thus the threshold voltage of the memory cell can be lowered to below 1 V. When the drain terminal voltage is 0 V, the absolute value of the floating gate voltage calculated from capacitance coupling is small, the tunneling mechanism through the gate oxide film does not occur, and the threshold voltage of the memory cell does not change. Though the voltages of the word lines of the non-selected block are all set to 0 V for the purpose of explanation, this value is not particularly limitative. For example, 3.3 V as the power source voltage may also be applied.

In this programming operation, the pull-out time of the electrons, that is, the programming time, is divided by 30, for example, and the threshold voltage of the memory cell is verified and is compared with the data in the latch circuit disposed for each data line whenever the programming operation is conducted once. If the threshold voltage is below a predetermined value (e.g., 1 V), the data in the latch circuit is re-written (e.g., from 3.3 V to 0 V) so as to inhibit the subsequent programming operation. When the threshold value is above the predetermined value (e.g., 1 V), one time of the programming operation is further added. In other words, when the threshold voltage of the memory cell reaches the predetermined low threshold voltage, the voltage of the latch circuit 33 reaches 0 V. In the subsequent programming operation, therefore, the voltage of the drain diffusion layer 7 becomes 0 V and the tunneling mechanism of the electrons does not occur. Programming can be attained into all the memory cells, that exist on one word line and require programming, without variance of data by repeating the flow described above. In this manner, the threshold voltage of the memory cells can be controlled to 0.5 to 1.5 V and at the same time, variance of the low threshold voltage can be restricted even when simultaneous programming is conducted in multiple bits. Accordingly, this embodiment can avoid the influences of variance on the low threshold voltage described in ACEE.

As described above, the threshold voltage can be lowered for only the memory cell having the data line to which the 3.3 V voltage is applied, and programming of data is effected. The time necessary for this programming is about one milli-second. The voltage applied to the data line described above is determined by disturbance characteristics to the memory cells on the same word line for which programming is not made. In other words, since a voltage 0 V is applied to the drain terminals and −7 V to the word line, and consequently, the electrons are gradually released from the floating gate. To limit the release of the electrons in the non-programmed cells, it is necessary to increase the difference of the drain voltages between the programmed cell and the non-programned cells. Though this embodiment uses the 3.3 V voltage, the absolute value of the negative voltage to be applied to the word line can be decreased and an undesirable decrease of the threshold voltage of a cell which is not selected for programming can be suppressed by the use of a voltage higher than 3.3 V.

In this embodiment, the 3.3 V voltage is applied to the word lines (W11, W1n) of the non-selected memory cells in the selected block at the time of programming. This is directed to improve the operation margin of the memory cell. The voltage applied to the non-selected word lines is determined depending on the number of times of program/erase. If the non-selected memory cell has a high threshold voltage, an extremely small tunnel current flows from the floating gate to the drain terminal, and there is the possibility that the electrons are pulled out from the floating gate with a result that the threshold voltage of the non-selected memory cell is decreased to such a level that the memory cell is no longer held in an erased state. The total time of program/erase of the non-selected memory cells is 31×1,000,000 times×1 msec=31,000 seconds when all the other word lines in the same block are subjected to the program/erase operations 1,000,000 times (assuming n=32). Therefore, the data of the memory cells must be held at least within the time described above. When the threshold voltage of the memory cell under the thermal equilibrium condition is high, the data can be held even when the voltage of the non-selected word lines is 0 V, but when the threshold voltage under the thermal equilibrium condition is lowered to 0.5 V, for example, the voltage of the non-selected word lines must be at least 1 V in order to relieve an electric field between the floating gate and the drain terminal. When the design range of the threshold voltage of the memory cells under the thermal equilibrium condition is expanded in this way, a positive voltage must be applied to the non-selected word lines, but the same voltage of 3.3 V as the power source voltage is shown used for ease of explanation.

Since the voltage to be applied to the non-selected word lines is set to 3.3 V as described above, the source wirings must be isolated for each data line in the nonvolatile semiconductor memory according to the present invention. For, when the threshold voltage of the memory cells connected to the non-selected word lines in the memory cell group 11 shown in FIG. 2 is low, the non-selected word lines are under the ON state because the voltage is 3.3 V and the voltage applied to the drain terminal (drain side diffusion layer wiring) is supplied to the source side. Accordingly, when the source terminal is a common terminal, the source voltage rises or an excessive drain current flows.

However, when the source wirings are merely isolated for each unit data line, the coupling capacitance of the source wirings extending parallel to the data line becomes great, and a charge current flows through the memory cell having a low threshold voltage on the non-selected word line to charge the isolated source wirings. Since this charge current flows, hot electrons which occur in the memory cell are injected into the floating gate. This invites a rise of the threshold voltage and inversion of data.

As shown in FIG. 2, therefore, this embodiment not only isolates the source wirings 14 in data line unit but also sections the word lines into groups 11 each including n (n=16 to 28) word lines as shown in FIG. 2. In this way, the source diffusion wiring layer of each group is connected to the common source line through the selection transistor while the drain diffusion wiring layer is connected to the respective data lines to lower the capacitance on the source wiring line, to reduce the quantity of the charge current flowing through the memory cell having a low threshold voltage and to prevent inversion of data.

This embodiment represents the case where the design range of the threshold voltage of the memory cell under the thermal equilibrium condition is expanded. When the threshold voltage under the thermal equilibrium condition is optimized, however, the data can be held even when the voltage of the non-selected word line is 0 V. Accordingly, isolation of the source terminals becomes unnecessary and the select transistor connected to SS1 can be eliminated.

In the read operation, SD1 and SS1 for the select transistors 15 and 16 are set to at least 3.3 v in order to activate the block 1 containing W12. As to the word lines inside the selected block, 3.3 V is applied to W12 and 0 V is set to all the other word lines. A predetermined read voltage is applied to the data line. When the threshold voltage of the object memory cell is low in this case, the voltage of the data line drops, and when the former is high, the threshold voltage can be kept at a predetermined voltage. Accordingly, the memory cell data can be judged by reading out this voltage difference into the latch circuit 33 in the sense/latch circuit 39.

The planar structure as well as the sectional structure of this embodiment will be explained with reference to FIGS. 4 to 6.

As shown in FIG. 4, a device isolation region 42 is defined in the direction of the data line 41 and the metal wiring 41 constituting this data line 41 is connected to the drain diffusion layer 44 of the select transistor through the contact hole 43. The drain diffusion layer 44 is connected to the drain diffusion layer inside the memory cell block through the gate 45 of the select transistor. The transistor region of the memory cell is the one where a region 46 (region outside the region encompassed by a frame) defining the first layer floating gate crosses a region 47 defining the word region 47. The floating gate of the memory cell has a two-layered structure, and the second layer floating gate is defined by a region 48. The portion between the region 46 and the device isolation region 42 is the diffusion layer wiring region, and the diffusion layer region on the source side is so formed as to oppose the diffusion layer region on the drain side. The diffusion layer region on the source side is connected to a common source region 50 through the gate 49 of the select transistor.

FIG. 5 is a structural sectional view taken along a line A–A' of the plan view of FIG. 4, and FIG. 6 is a structural sectional view taken along a line B–B'. Each memory cell region is isolated by a device isolation region 51 formed by a LOCOS (Local oxidation of Silicon) oxide film. The floating gate has a two-layered structure so as to improve a capacitance coupling value of the floating gate electrode and the word line and to lower the program/erase voltage. Accordingly, where simplification of the process is important, the floating gate 56 need not always be formed. The memory cell according to this embodiment is formed on the p type silicon substrate, but it can be formed on a p type well region formed on the p type silicon substrate by the CMOS process, or on a p type well region on an n type silicon substrate. The word lines are equidistantly formed in the section parallel to the data lines (FIG. 6) with a minimum process size, and the first and second floating gates 54, 56, the intermediate insulating film 57 and the control gate 58 serving as the word line together form a laminate structure. The word lines are isolated from one another by a p type impurity region 76 which is introduced by ion implantation.

In this embodiment, one bit can be formed in a length of about three times the minimum process size in the plane A–A' parallel to the word lines and in a length about twice in the plane B–B'. In other words, the memory cell area of about 0.74 square microns can be obtained under the minimum process accuracy of 0.35 microns.

The description given above explains the fundamental operations of erase, programming and read of data inside the blocks of the nonvolatile semiconductor memory device, and the operations of the nonvolatile semiconductor memory device using these functions will be explained with reference to FIGS. 20 to 27.

Figure 20:
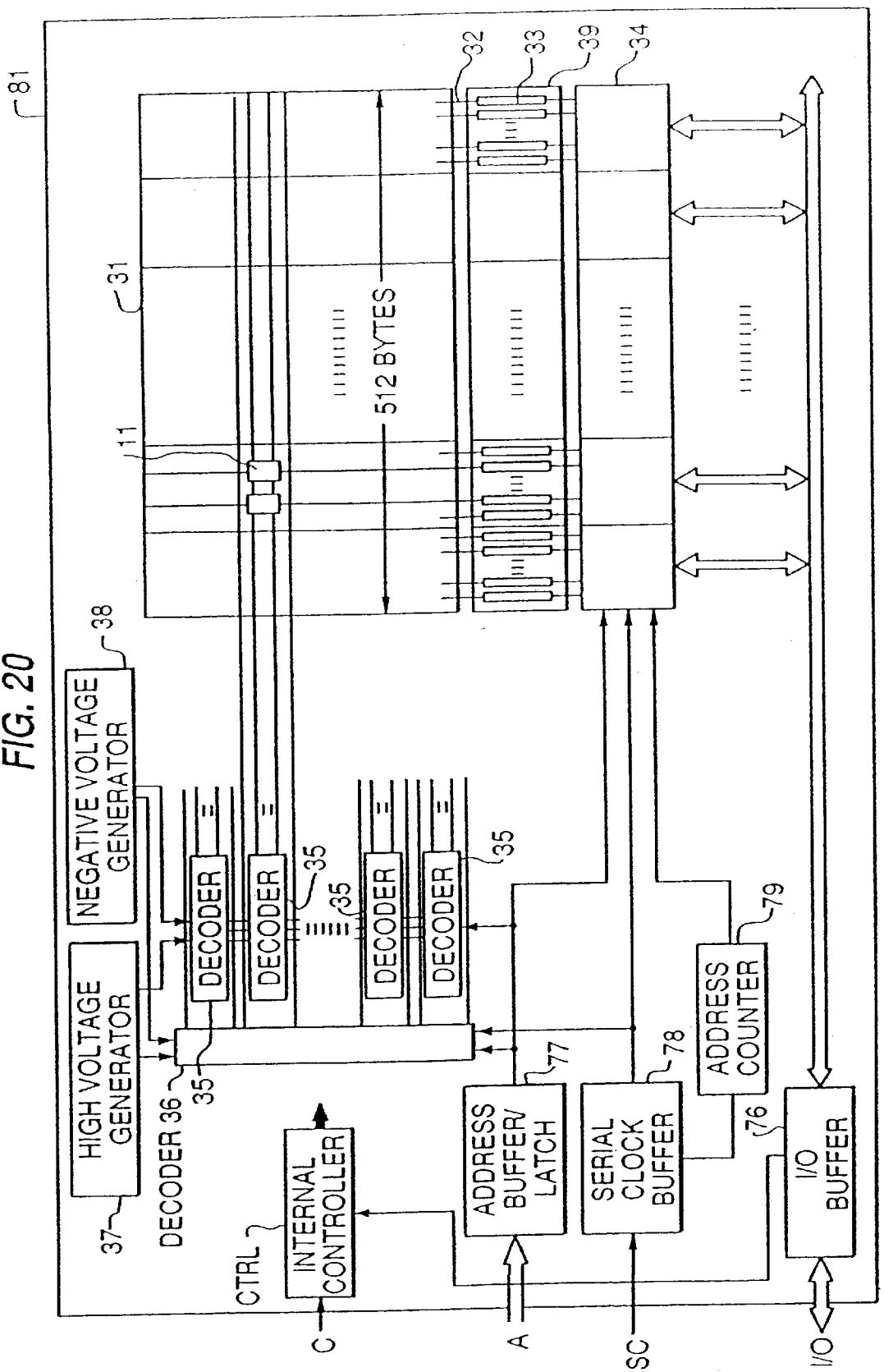
FIG. 20 is a block diagram of a nonvolatile semiconductor memory device according to another embodiment of the present invention.

FIG. 20 shows in detail a block structure of a semiconductor chip 81 including the nonvolatile semiconductor memory device shown in FIG. 3, the peripheral circuits connected to the former and means for controlling them. A memory array portion 31, a sense circuit 39 and a decoder 34 are divided into eight segments, for example, in accordance with the degree of parallelism of an input/output circuit 76, and are electrically connected with the outside of the chip 81 through an input/output circuit 76.

In the memory array portion 31, 512-byte memory cells are connected to one word line. As already described, since data is mainly handled in a 512-byte unit in the existing fixed memory devices, the 512-byte memory cells are connected to one word line but needless to say, the number of the memory cells on the word line can be changed appropriately in accordance with the intended application of the nonvolatile semiconductor memory device.

Reference numeral 11 denotes a cell group which is similar to the cell group shown in FIG. 2 and typifies one of the cell groups contained in the cell block handled by one decoder 35. Though not shown in FIG. 2, select transistors similar to the select transistors 15, 16, 19, 20 shown in FIG. 20 are disposed between the cell groups belonging to the adjacent cell blocks. A memory cell having (512 bytes+ redundancy bits) can be connected to each input/output circuit in consideration of memory cells for redundancy. The address signal is stored in an address buffer/latch 77 and is transmitted to at least decoders 35, 36, and one of the word lines is selected.

An input address signal A is transmitted to the decoders 35, 36 in the random access operation whereas in the serial access operation, it is transmitted to the decoders 35, 36 a serial clock SC is inputted to a block buffer 78 and an internal address signal generated by an address counter 79 is transmitted to the decoder 34.

Figure 21:
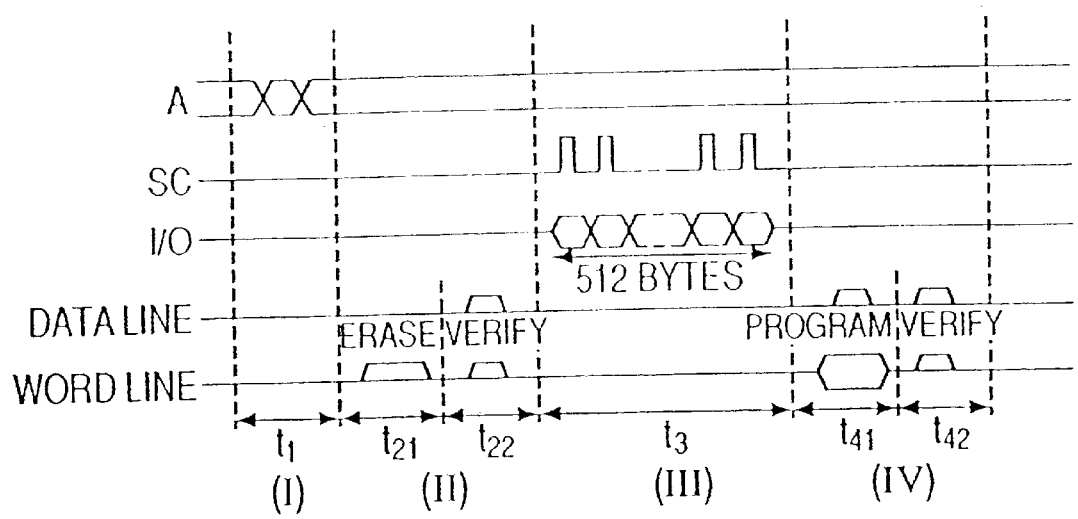
FIGS. 21 to 24 are diagrams illustrating various operations of the device shown in FIG. 20.

FIG. 21 shows a timing chart for basic input data at the time of data erase/program, i.e., data re-write. When a chip is selected and after external instructions such as read, erase/program, etc., are accepted, each operation is carried out. Hereinafter, an example of an erase/program (re-write) operation executed under the control of the internal controller CTRL on the basis of the external control signal C will be described, but other operations such as data erase, programming, etc., can of course be executed similarly. Various signals associated with erase/program (re-write) are generally inputted at the time of erase/program, but those which are not directly relevant to the gist of the present invention will be omitted.

First of all, the chip is selected, the erase/program instruction (C) is inputted, and the address signal A is further inputted (I). The erase word line is selected in accordance with the input address signal A and erase is effected in the manner described above. In other words, a high voltage of about 12 V is applied to the selected word line from a high voltage generator 37 and the 512-byte memory cells on the word line are collectively or simultaneously erased. To confirm that the memory cells on the word line are under the erase state, a voltage of 5 V, for example, is applied to the word line while a voltage of about 1 V is applied to the data line and a threshold voltage is judged for verification. The operation is again executed until all the bits on the selected word line are erased (II). Next, the data is serially inputted in a 512-byte length from the I/O terminal. The input data is sequentially stored in the data latch 33 inside the sense circuit 39 in synchronism with the serial clock SC (III). Since the data input is transferred in an interval of 50 to 100 ns, the time t3 required for the data input (III) is at most 100 μs. After this data transfer is completed, the data write (IV) is effected. A voltage of −7 V is applied to one word line corresponding to the selected address from a negative voltage generator 38, 3.3 V or 0 V is applied to the data line in accordance with the data stored in the latch circuit 33 corresponding to each bit in the sense circuit 39. Programming (t41) and programming verify (t42) are executed as described above and the programming operation is completed.

Thus, the data erase/program operation in the described embodiments no longer needs a light (weak) programming operation called "a pre-write" which is conventionally effected prior to an erasing operation.

Figure 22:
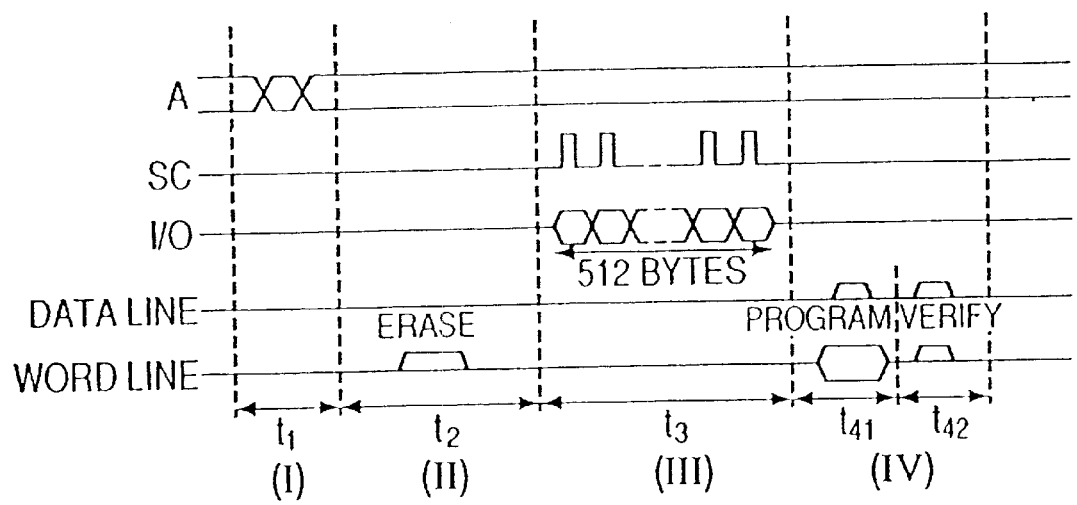
Figure 23:
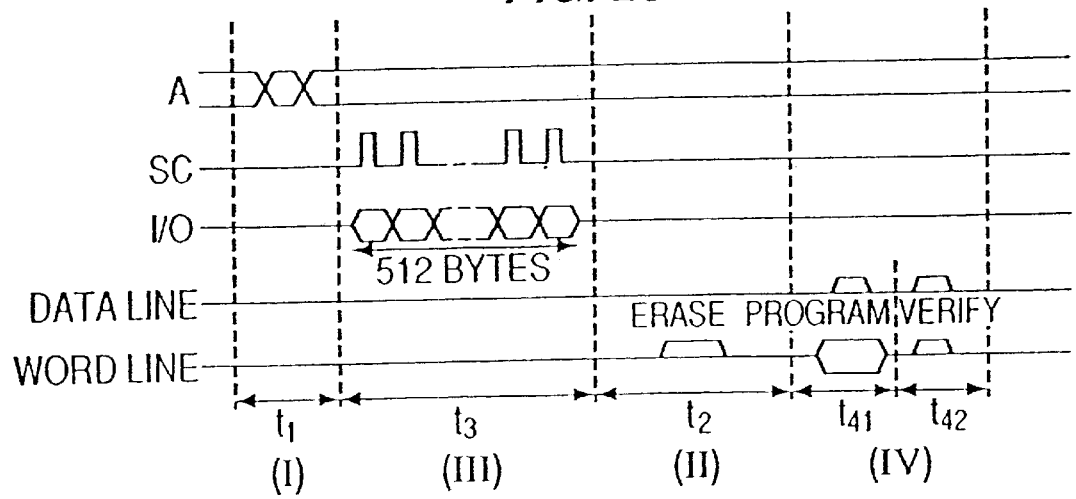

As already described, erase is effected by tunnel injection through the gate oxide film. Accordingly, the high voltage generator 37 increases the voltage to be applied for erase, and the threshold voltage of the memory cell after erase can be set to a sufficiently high level. In this case, verify of the erase state of the memory cell after erase becomes unnecessary as shown in FIG. 22 and the verify process can be omitted. Since the data latch 33 that has been occupied for reading memory cell data for the verify process after erase can be released, the transfer of the erase/program data can be made after the address input. In other words, the operation shifts to the data input (III) after the address input (I) as shown in FIG. 23, and the 512 bytes can be serially inputted. Accordingly, the process from the address input to the data input can be executed continuously without the necessity for waiting for the erase time, and the occupying time of the external I/O can be reduced.

Figure 24:
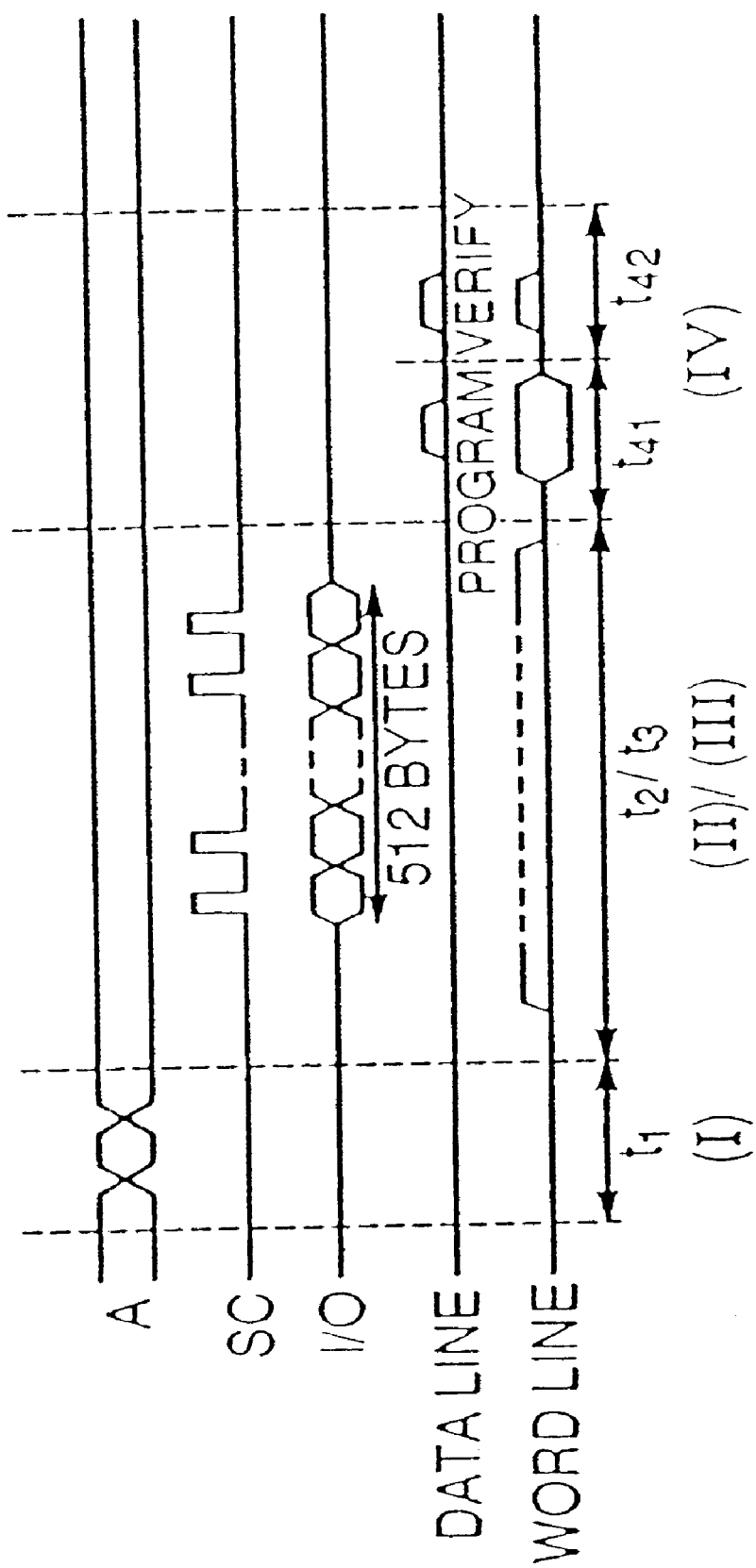

In FIG. 22, on the other hand, the data input (III) is effected between the I/O terminal and the data latch 33 and erase (II) is effected for at least one of the word lines in the memory array 32. Accordingly, the data input (III) and the erase (II) can be effected simultaneously, too, under the control of the internal controller CTRL, as shown in FIG. 24.

As illustrated in this embodiment, data erase and data write can be effected for each word line and in consequence, parity can be established between the erase unit and the programming unit and this can be used as a sector. In the conventional NOR type flash memory, the erase unit is greater than the programming unit. To erase/program the data, therefore, the data of the erase region must once be saved in the external buffer region. In this embodiment, in contrast, since the erase unit and the programming unit coincide with each other, the data save operation is not necessary. As a result, erase/program for one word line can be made by a single address input and a single serial data transfer, and the erase/program operation can be executed by one instruction.

Figure 25:
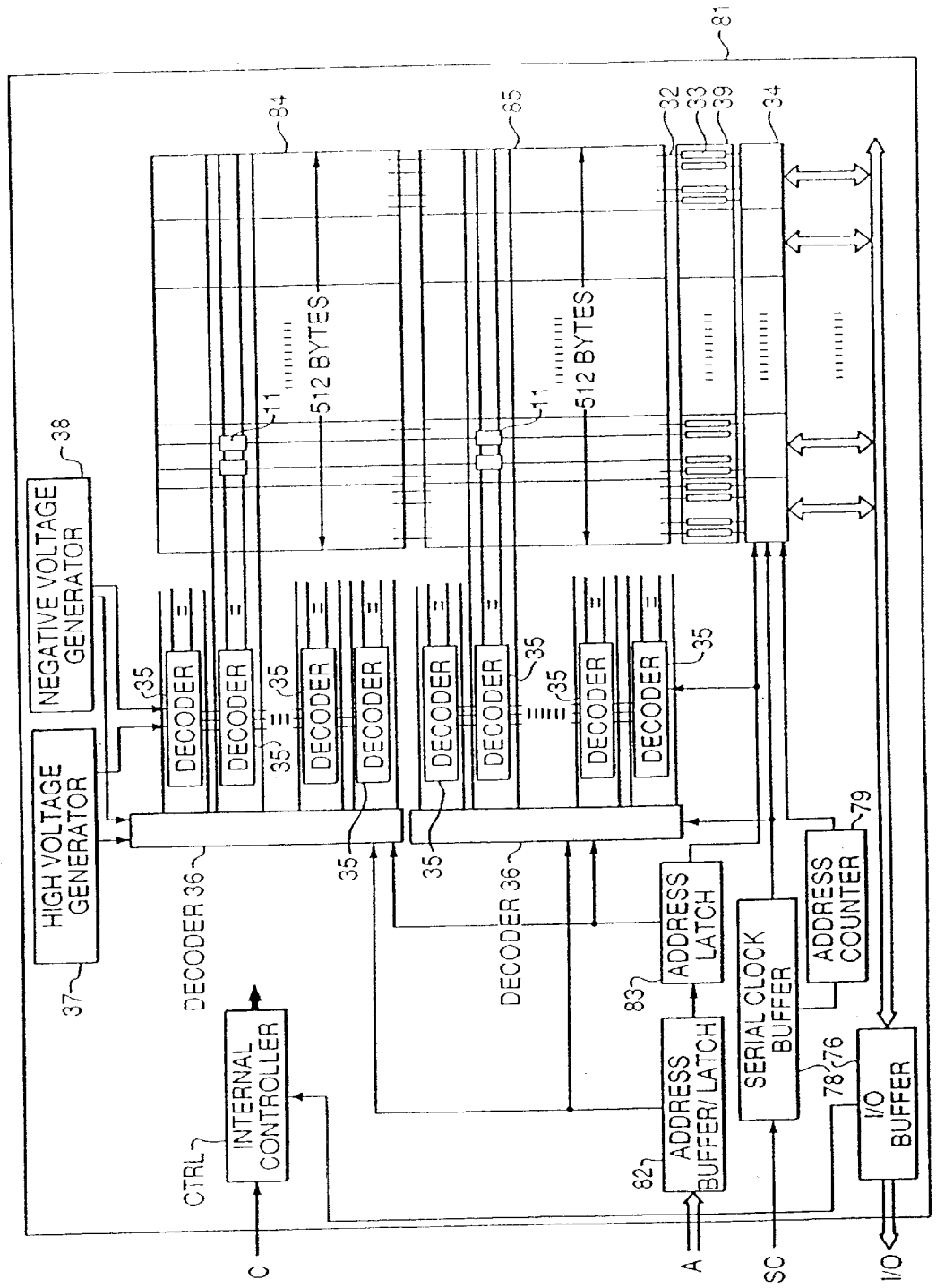
FIG. 25 is a block diagram of a nonvolatile semiconductor memory device according to another diagram of the present invention.

The erase/program operation shown in FIG. 23 can be processed in parallel by converting the memory array portion 31 shown in FIG. 20 into a two-array block structure as shown in FIG. 20 and by adding an address latch 83 as shown in FIG. 25. This can be accomplished because the memory array portion 31 is divided into the array blocks and because the erase unit and the programming unit coincide with each other. However, in view of continuity of a plurality of serial data, the address of the continuous sector has a parity bit or a memory array block select bit to gain an access to mutually different array blocks in a file allocation table for managing a file system using the memory chip 81 of the embodiment.

Figure 26:
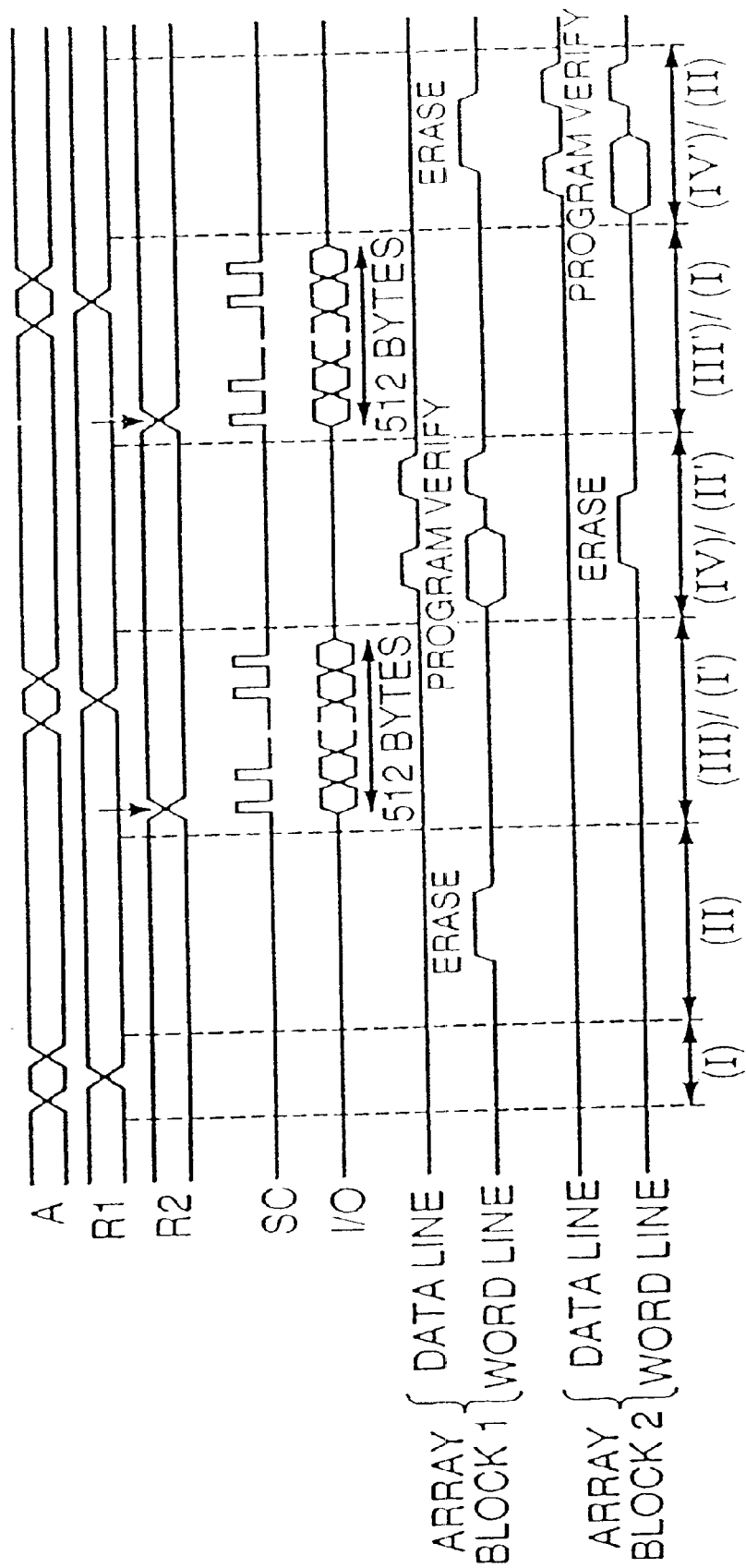
FIG. 26 is a diagram illustrating various operations of the device shown in FIG. 25.

FIG. 26 shows the timing chart of this embodiment. The address signal A is inputted (I) and is stored (R1) in the address buffer/latch 82. The address buffer/latch 82 is used for erase, and erase is effected for one of the word lines in the array block 84, for example (II). After this erase is completed, the address in the address buffer/latch 82 is transferred to the address latch 83, and the data input (III) is executed. The next address signal A is inputted (I') in the data input (III) and is stored (R1) in the address buffer/latch 82. After the data input (III), the data in the data latch 33 is written (IV) to the address stored in the address latch 83, that is, one word line in the array block 84 erased as described above. Here, the erase operation (II') for one word line in the array block 85 is executed simultaneously in accordance with the address buffer/latch 82.

According to the array block structure of the conventional NOR type flash memory, the memory cells are directly connected to one data line. Therefore, erase and programming cannot be executed simultaneously by merely dividing the memory array portion into the array blocks. In contrast, according to this embodiment, the memory cell is indirectly connected to the data line through the select transistors 15, 16 (FIG. 2).

Therefore, when the data is written into the memory cell in the array block 84 and, at the same time, the data of the memory cells in the array block 85 is simultaneously erased, the select transistors on the data line side corresponding to the selected cell block 80 are turned ON so as to transfer the voltage of the data line to the sub-data line and to effect programming into the array block 84. Moreover, the select transistors on the data like side corresponding to the selected cell block 80 are turned OFF so as to bring the sub-data line into the open state and the select transistors on the source line side into the ON state, and the ground to the sub-source line, for effecting erase in the array block 85. As described above, erase in the word line unit is possible and the memory cells are isolated by selected transistors in this embodiment. Accordingly, when the memory array 31 is divided into the array blocks, erase and programming can be simultaneously executed inside the chip. Furthermore, since the data write time and the data erase time are about 1 $\mu$m and are equal to each other as already described, no overhead of time exists when the data programming operation and the data erase operation are executed simultaneously. When programming and erase are processed in parallel, the erase/program time as viewed from outside the chip can be reduced to about 50%.

The second embodiment of the present invention will be explained with reference to FIGS. 8 and 9.

Figure 8:
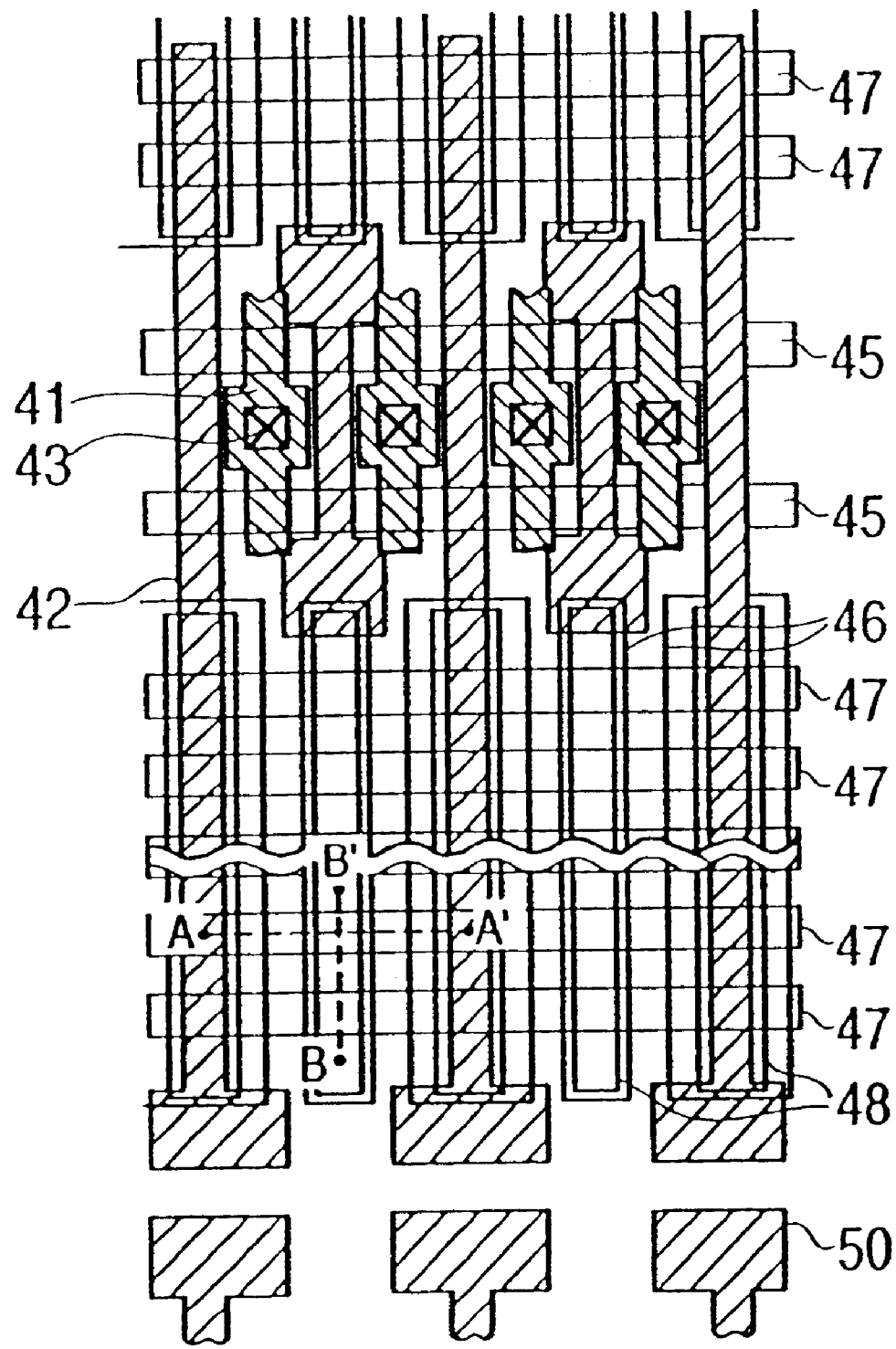
FIG. 8 is a plan view showing the memory cell structure of a nonvolatile semiconductor Memory according to the second embodiment of the present invention.
Figure 9:
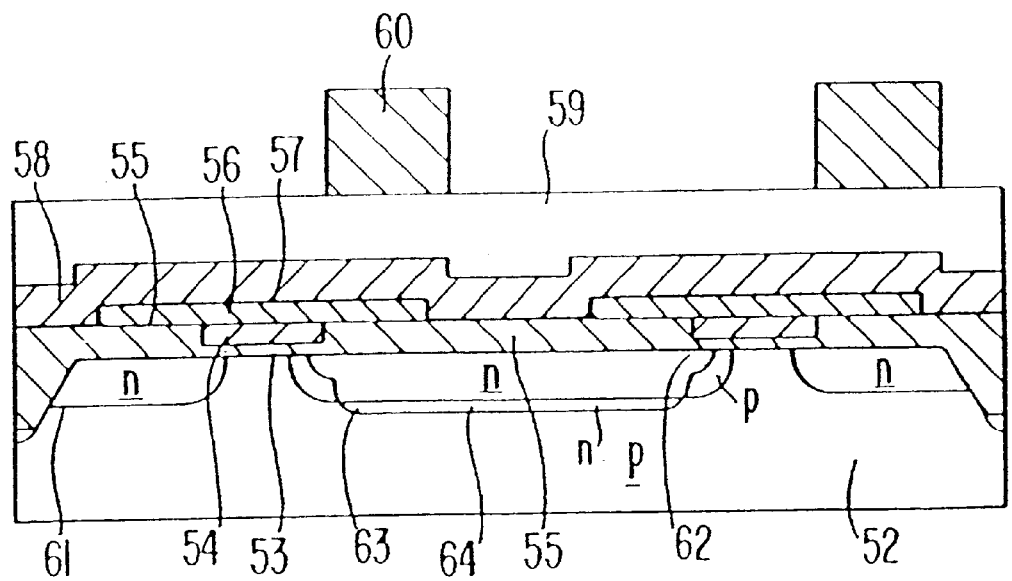
FIG. 9 is a sectional view showing the memory cell shape when taken along a line A–A' of FIG. 4.

FIG. 8 is a plan view of the memory block. As demonstrated by the operation of the first embodiment of the present invention, the data can be held at the voltage of 0 v of the non-selected word lines when the threshold voltage under the thermal equilibrium condition is optimized, so that isolation of the source terminals becomes unnecessary and the select transistors connected to the source terminal side can be omitted. The plan view of FIG. 8 illustrates a planar pattern when the source terminal of the memory cells is used in common. In other words, the transistor region of the memory cell defined by the region, where the region 46 defining the first layer floating gate (the region outside the frame) crosses the region 47 defining the word lines is in contact with the transistor region of an adjacent memory cell without the LOCOS region. FIG. 9 shows the sectional structure taken along the line A–A' of FIG. 8. By the way, the sectional structure in the B–B' plane of FIG. 8 is the same as that of FIG. 6. The source region 63 is used in common by the two memory cells on the word line 58, and the drain diffusion layer 61 is formed independently and individually for each memory cell. In this way, the length of the memory cell in the direction of the word line can be reduced, and the memory cell area can be further reduced. Incidentally, the operation of this memory cell structure is shown in Table 2 of FIG. 19.

Figure 10:
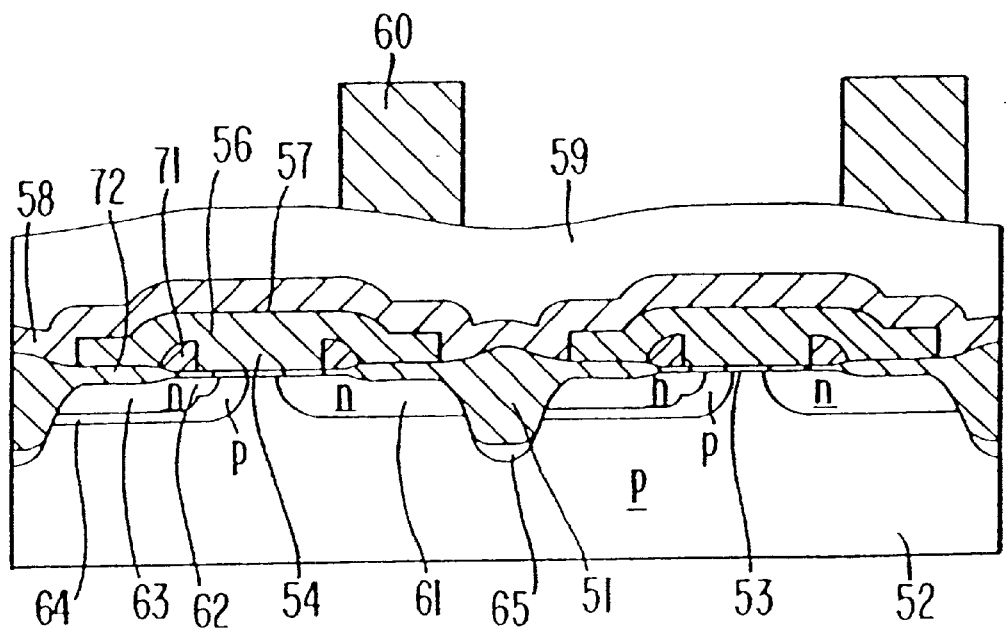
FIG. 10 is a sectional view showing the memory cell shape when taken along a line A–A' of FIG. 4, according to the third embodiment of the present invention.
Figure 11:
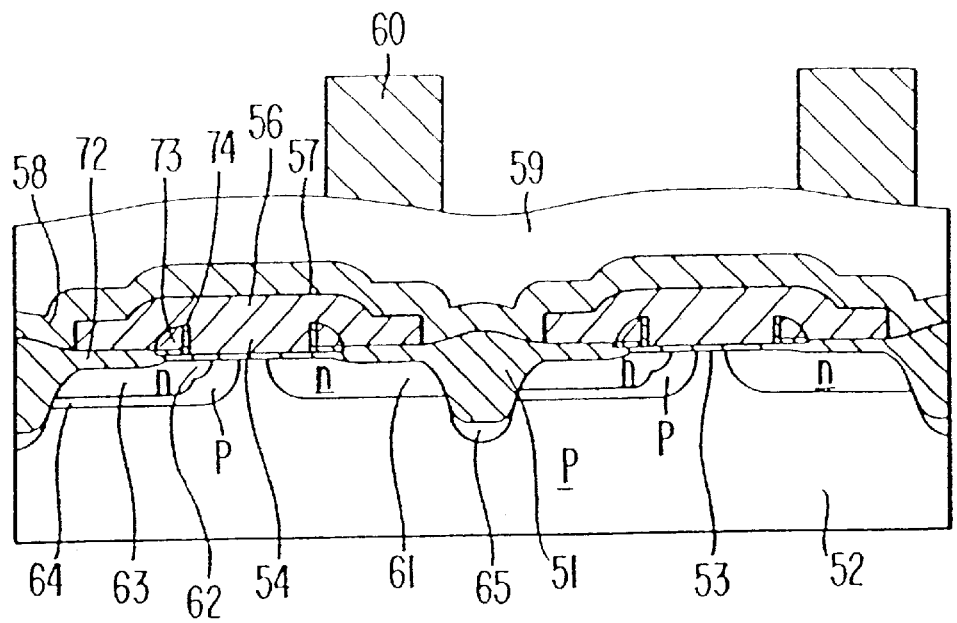
FIG. 11 is a sectional view showing the memory cell shape when taken along a line A–A' of FIG. 4 as an expanded example of the third embodiment of the present invention.

FIG. 10 shows the third embodiment of the present invention. This embodiment uses a deposited oxide film 71 on the side wall and a thermal oxide film 72 formed by a thermal oxidation process and a film thickness of 50 to 300 nm as the insulating film to be formed on the side surface of the floating gate 54 of the first embodiment. A silicon dioxide film or a silicon nitride film, that is formed by a CVD process, can be used as the deposited oxide film 71 on the side wall. However, the silicon dioxide film is preferably used in order to improve program/erase reliability of the memory cell. According to this structure, the impurity diffusion layer 63 as the diffusion wiring layer can be formed easily by an ion implantation process using the first floating gate 54 and the deposited oxide film 71 on the side wall as the mask. As shown in FIG. 11, the thermal oxide film 72, the silicon dioxide film 73 and the silicon nitride film 74 can be used as the insulating film 55 shown in FIG. 5. This embodiment suppresses invasion of a birds beak immediately below the floating gate that proves the problem when the silicon nitride film 74 is formed as the base of the silicon dioxide film 73 and between this silicon dioxide film 73 and the first floating gate 54 and the thermal oxide film 72 is formed by the thermal oxidation process.

This embodiment makes it easy to form the thermal oxide film 72 between the floating gate 56 and the silicon substrate by forming the deposited oxide film and the silicon nitride film on the side surface of the floating gate 54. Generally, when the thermal oxide film 72 is formed in the vicinity of the floating gate, a birds beak region will enter the tunnel oxide film 53 due to the thermal oxidation process, and the tunnel oxide film is likely to become thick. This embodiment suppresses the progress of the oxidation on the side surface of the floating gate by the use of the deposited oxide film and the silicon nitride film, prevents the increase of the film thickness of the tunnel oxide film and can thus prevent degradation of the memory cell characteristics.

Figure 12:
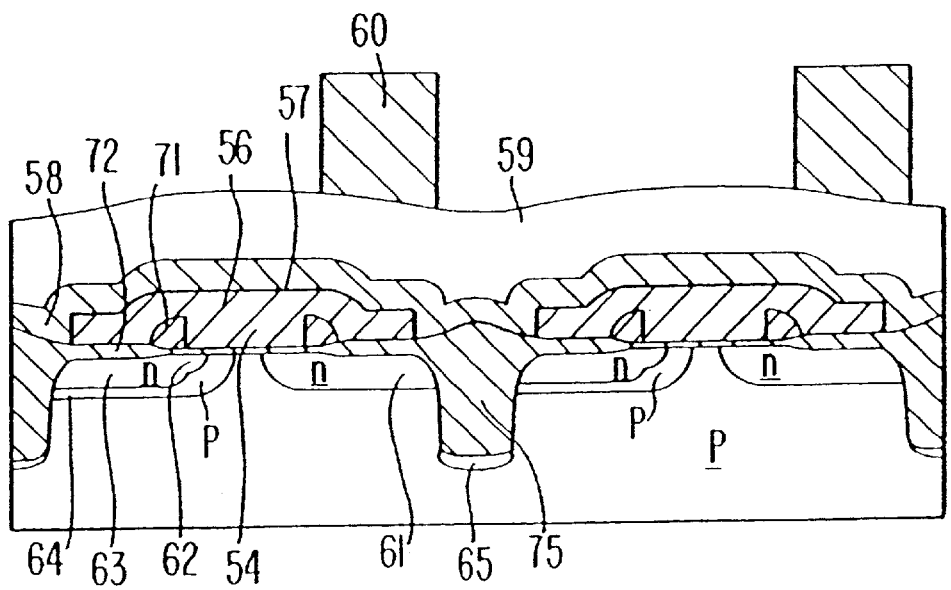
FIG. 12 is a sectional view showing the memory cell shape when taken along a line A–A' of FIG. 4, according to the fourth embodiment of the present invention.

FIG. 12 shows the fourth embodiment. This embodiment uses a device isolation structure 75 of a shallow ditch for the device isolation region in the third embodiment. In the rule of below 0.35 microns for accomplishing a 256 MB large capacity memory, for example, it becomes difficult to form a narrow device isolation region by the use of the silicon dioxide film formed by the thermal oxidation process. Particularly in the case of the nonvolatile memory cell according to the present system, overlap must be secured between the first floating gate and the drain side diffusion layer in order to obtain a sufficient tunnel current. In other words, the junction depth of the drain side n type diffusion layer of at least 0.1 micron must be secured, and the depth of the shallow ditch region of about 0.2 microns must be secured.

Figure 13:
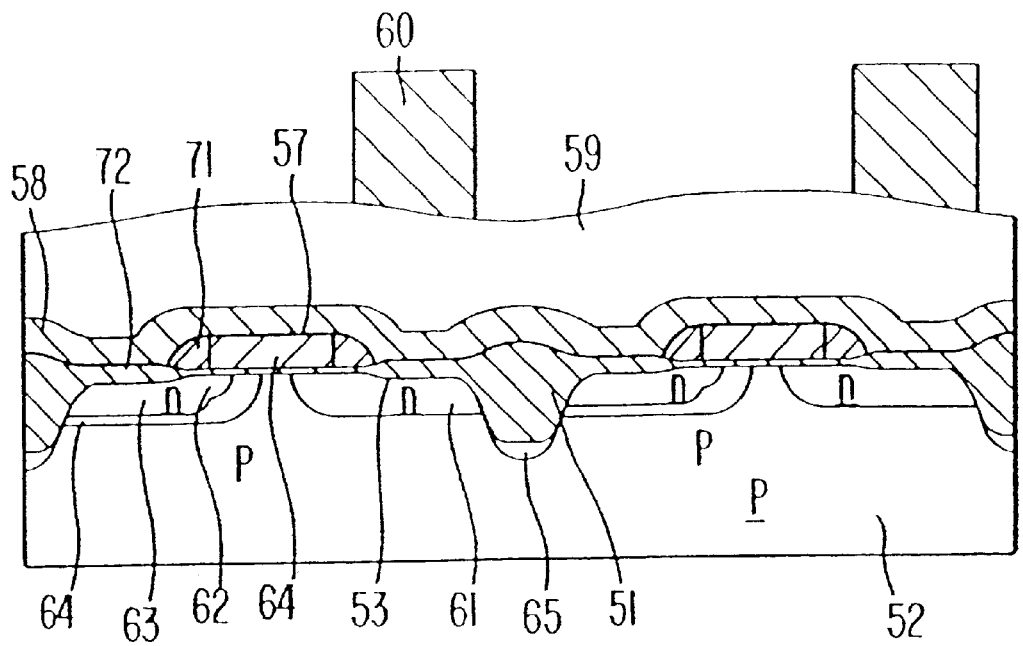
FIG. 13 is a sectional view showing the memory cell shape when taken along the line A–A' of FIG. 4, according to the fifth embodiment of the present invention.

FIG. 13 shows the fifth embodiment. Whereas the floating gate has the two-layered structure in the fourth embodiment, it is formed only by the first level floating gate 54 in this embodiment. For this reason, the intermediate insulating film 57 is formed not only on the floating gate but also on the deposited oxide film 71 formed on the side surface of the floating gate 54. In this embodiment, the capacity of the floating gate 54 and that of the control gate 58 are small. Therefore, the control gate voltage necessary for program/erase must be set to a high level or the program/erase time must be prolonged. However, since the floating gate has the single level structure, the memory cell fabrication process is simplified, and an economical nonvolatile semiconductor memory for the application of external memories not requiring high speed performance can be provided.

Figure 14:
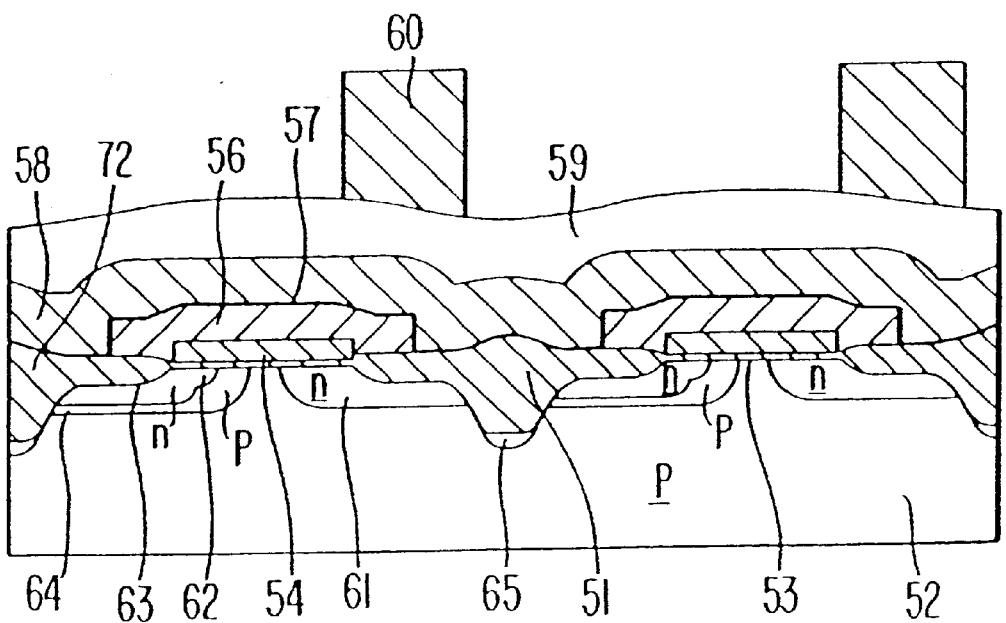
FIG. 14 is a sectional view showing the memory cell shape when taken along the line A–A' of FIG. 4, according to the sixth embodiment of the present invention.

FIG. 14 shows the sixth embodiment. In the third embodiment, the thermal oxide film 72 is formed by using the deposited oxide film 71 as an oxidation-resistant film as shown in FIG. 10, but this embodiment forms the thermal oxide film 72 without forming the deposited oxide film 71. Accordingly, the formation step of the deposited oxide film can be omitted, and the number of the process steps can be reduced.

Figure 15:
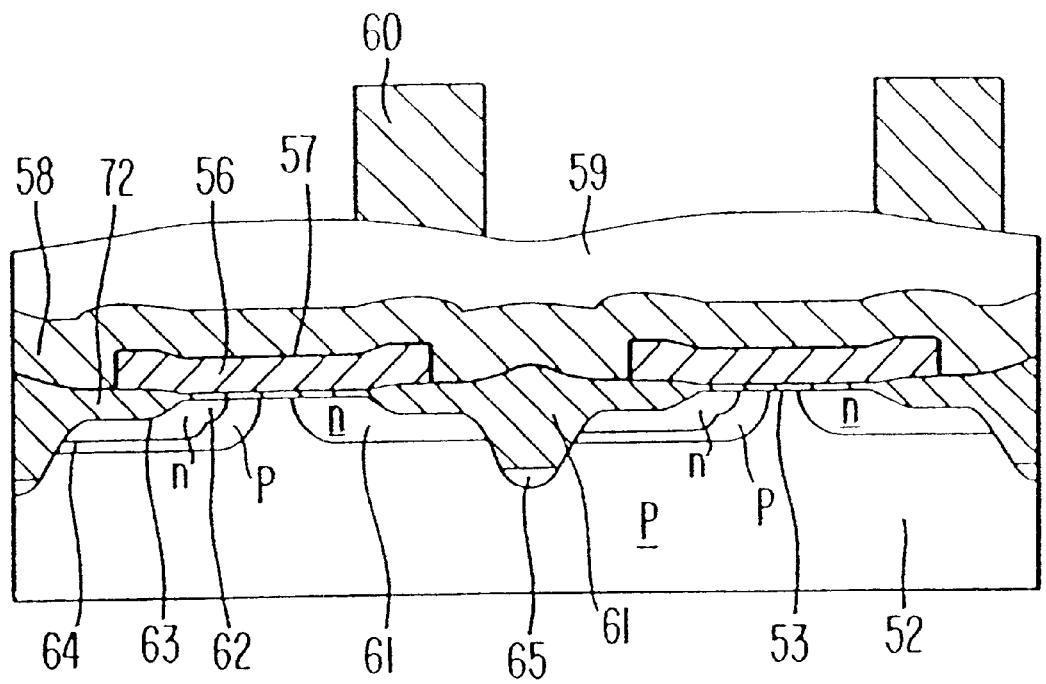
FIG. 15 is a sectional view showing the memory cell shape when taken along the line A–A' of FIG. 4, according to the seventh embodiment of the present invention.

FIG. 15 shows the seventh embodiment In the sixth embodiment, the floating gate electrode has the two-layered structure of the first floating gate 54 and the second floating gate 56 as shown in FIG. 14, but the floating gate electrode in this embodiment has a single layer structure of the second level floating gate alone. This can be accomplished by first forming the thermal oxide film 72 and then forming the floating gate electrode 56. Since this embodiment can accomplish the single layer structure of the floating gate, too, it can simplify the fabrication process.

Figure 16:
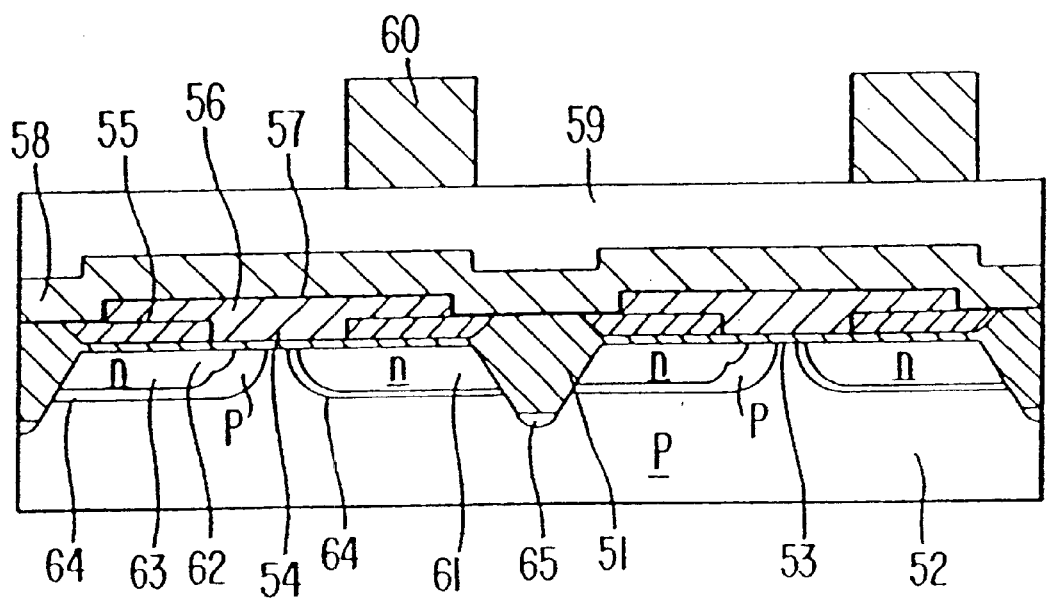
FIG. 16 is a sectional view showing the memory cell shape when taken along the line A–A' of FIG. 4, according to the eighth embodiment of the present invention.

FIG. 16 shows the eighth embodiment. In the first embodiment, the p type diffusion layer region 64 for the channel stopper is formed on the source terminal side as shown in FIG. 5, but in this embodiment, the p type diffusion layer regions are formed on both sides of the source and drain terminals by an angular ion implantation process, for example. In this way, the process can be simplified.

A low voltage single power source drive type high speed large capacity nonvolatile semiconductor memory can now be fabricated according to the memory cell structure of the present invention such as the sector structure using 512 bytes as a basic unit, a block structure for reducing the area of the contract hole by putting together 32 to 128 word lines, and further by the modification of program/erase system. A data memory of a card type can be produced using this nonvolatile semiconductor memory, and can be used as an external storage for a work station or as a storage of an electronic still camera. Since the word line is segmented for each sector as illustrated in the first embodiment, the data erase unit can be set in an arbitrary scale, and a part of the memory can be assorted to the program region of the system with the rest being secured as the data region.

Figure 17:
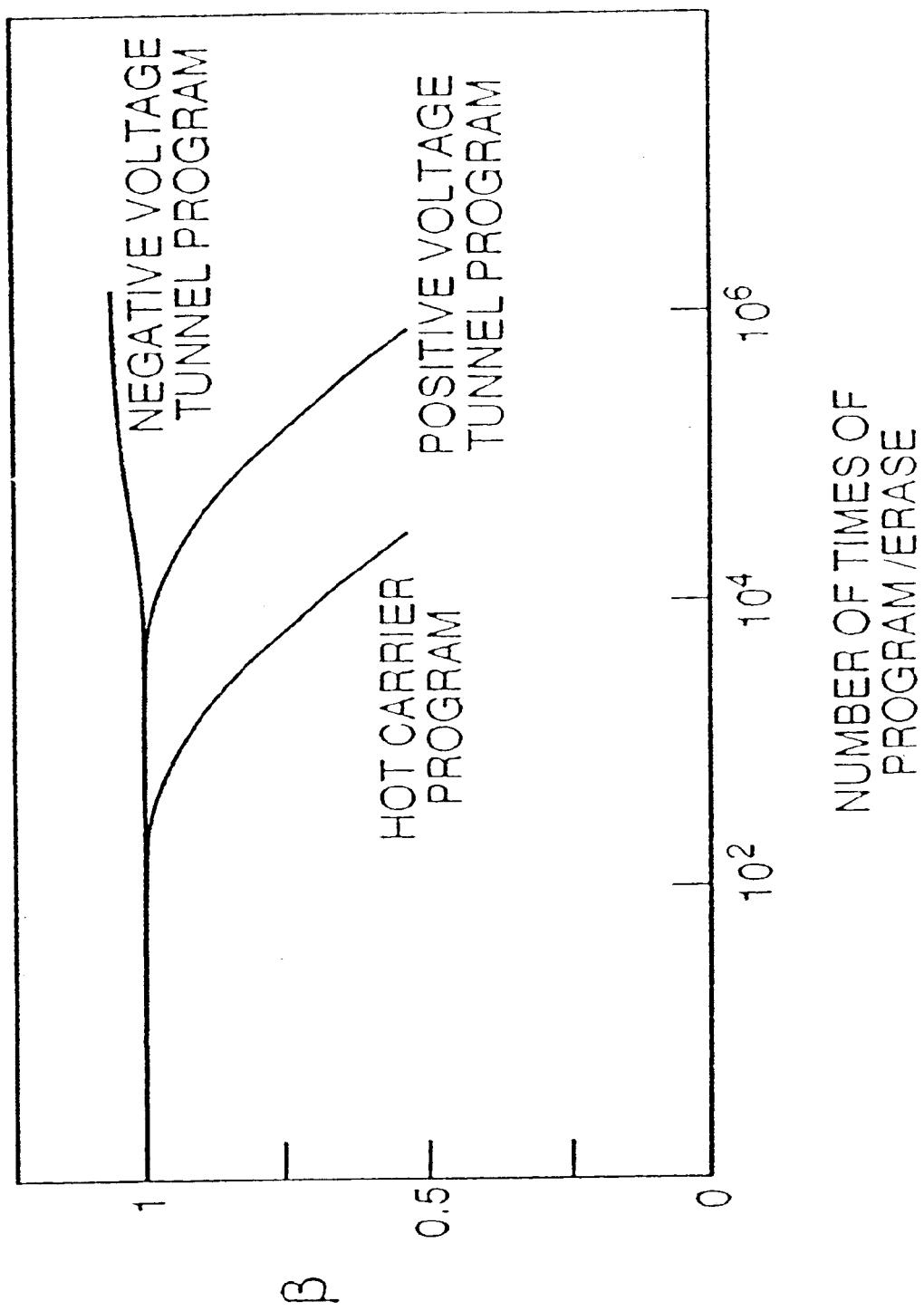
FIG. 17 is a graph showing dependence of current supply drivability on the number of times of program/erase.

FIG. 17 is a graph showing dependence of current drivability on the number of times of program/erase. This graph comparatively shows the case where programming is made by hot carriers according to the prior art, the case where programming is made by applying a positive voltage to the word line and utilizing the tunneling mechanism, and the case where programming is made by applying a negative voltage to the word line and utilizing the tunneling mechanism in accordance with the present invention. It can be understood clearly from the graph that when programming is made by applying the negative voltage to the word line and utilizing the tunneling mechanism according to the present invention, the drop β of current drivability can be suppressed. The detailed description of the hot carriers will be omitted.

However, when programming is effected by applying the positive voltage to the data line and utilizing the tunneling mechanism, that is, when programming is effected by grounding the control gate and applying the positive voltage $V_p$ to the drain diffusion layer, the hole among the electron-hole pair occurring at the drain terminal is injected into the gate oxide film in accordance with the direction of the electric field. When the number of times of program/erase is small, the injection quantity of the holes is small and degradation occurs only at the drain terminal, so that the drop β of the memory cell does not occur. When the number of times of program/erase increases. However, the injection quantity of the holes increases and degradation expands from the drain terminal near to the source. In consequence, β of the memory cell drops. When programming is effected by applying the negative voltage to the word line and utilizing the tunneling mechanism according to the present invention, however, the electron-hole pair occurring at the drain terminal can be suppressed by setting the drain voltage to a positive voltage of about 3.3 V, for example, and thus the drop β of the memory cell can be prevented.

Figure 27:
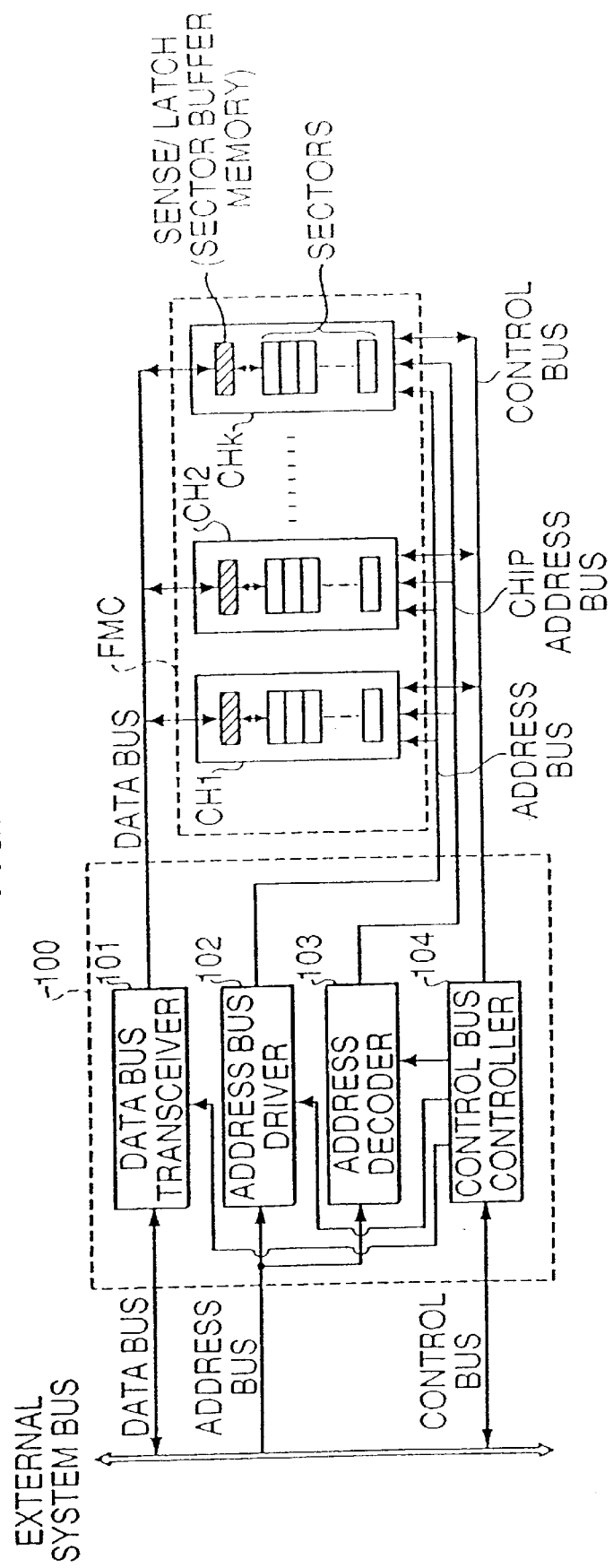
FIGS. 27 to 29 are block diagrams of memory systems according to other embodiments of the present invention.

FIG. 27 shows an embodiment of an effective memory system structure using the nonvolatile semiconductor device FMC including the flash memory chips CH1 to CHk according to the present invention. Each of these flash memory chips CH1 to CHk can take the same structure as that of the chip 81 shown in FIGS. 20 to 25. Each of the chips CH1 to CHk includes a plurality of sectors each comprising one word line and a plurality of memory cells connected to this word line, and includes further a sector buffer memory disposed between the outside of the chip and the data bus (corresponding to the sense latch circuit 30 shown in FIGS. 20 and 25). The memory chips CH1 to CHk are connected in parallel with one another and constitute the nonvolatile semiconductor device FMC. The number of these memory chips CH1 to CHk may be from 8 to 20, for example. The input data is supplied through a data bus transceiver 101 and through an external system bus such as PCMCIA (Personal Computer Memory Card International Association) standard, IDE (Intelligent Device Electronics) standard, I/O buses of CPU, and so forth. The memory system includes an address decoder 103 for selecting the memory chips, and address bus driver 102 for the address input for selecting the sectors inside the chip and a control bus controller 104 for address decoding, data control and chip control. The data bus transceiver 101, the address bus driver 102, the address decoder 103 and the control bus controller 104 together constitute a host interface 100.

In FIG. 27, the external system bus is to be released from a busy state once an external address signal has been transferred to the address bus driver 102 and an address decoder 103, the address bus driver 102 and address decoder 103 have a structure for performing function of latching their outputs so that internal address signals are latched therein. This also applies to the later described embodiment with reference to FIG. 29.

In the conventional memory system, the sizes of erase and programming of the chip are different. Therefore, it has been necessary to temporarily save (store) the data of the memory chip to be erased into a buffer memory disposed outside the chip before erase, to erase/program (i.e., to re-write) the content of the buffer memory by inputting the write data, and then to sequentially write back the data within the erased range into the chip in a certain write unit.

According to the memory system shown in the drawing, a memory card system corresponding to the data bus such as PCMCIA, etc., can be constituted, but when the non-volatile semiconductor device FMC according to the present invention is employed, the temporary data save operation, which has been necessary at the time of erase/program of the data in the conventional memory system, is no longer necessary because the size of the sector buffer memory disposed inside the chip is at least the same as the size of erase/programming. In other words, the buffer memory which has been necessary in the conventional memory card system can be omitted. Since the temporary save operation is not necessary, erase and programming can be effected continuously. For example, the time necessary for erasing/programming the data having the unit memory region capacity for erase of 4K bytes and the quantity of data to be erased/programming of 512 bytes has been (erase 1 ms+write 1 ms/512 bytes×8) and has been 9 ms. In the memory system using the non-volatile semiconductor device FMC according the present invention, the time is (erase 1 ms+write 1 ms) and is reduced to 2 ms. When 4 K-byte data is erased/programmed, the time of 9 ms is necessary according to the conventional structure by the same calculation. In the memory system according to this embodiment, however, a plurality of word lines (a plurality of sectors) are simultaneously selected and erased and consequently, the necessary time is (erase 1 ms+write 1 ms/512 bytes×8), i.e. 9 ms, and this value is approximate to the time necessary in the conventional structure.

Figure 28:
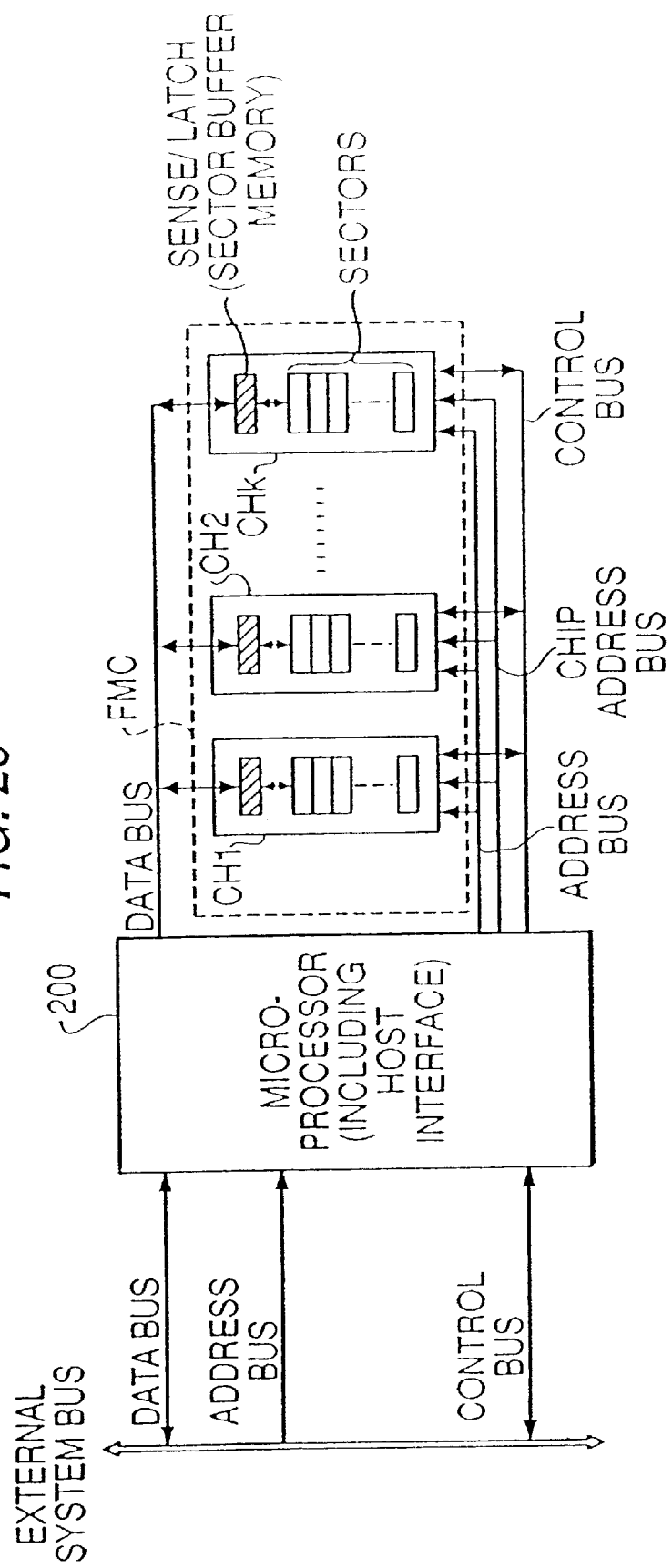

FIG. 28 shows the structure of another effective memory system. In this embodiment, the host interface 100 is changed to a microprocessor 200. Since the size of the sector buffer memory disposed inside the chip in this structure is at least the same as the size of erase programming, it is necessary only to transfer the data from the system bus to the sector buffer memory inside the chip, and control can be easily by a one-chip microcomputer. According to this structure, the number of components on a card can be reduced when this system is expanded on the card.

Figure 29:
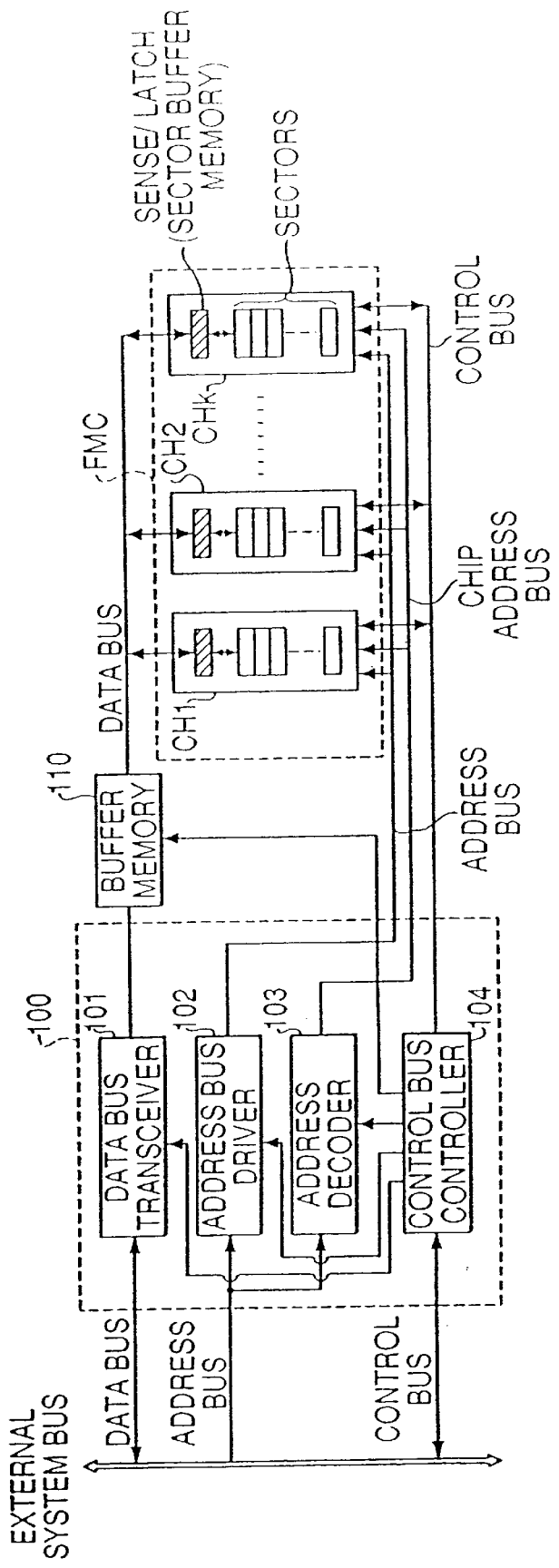

FIG. 29 shows a structural example of the memory system equipped with an external buffer memory as well as a memory chip similar to the memory chip FMC shown in FIG. 27 is used. A buffer memory 110 of at least 512 bytes is provided to the data bus shown in FIG. 27 so that control from the control bus controller 104 can be made. As described above, the conventional structure needs a buffer memory of at least 4K bytes for erasing/programming data by saving the data of the erase unit memory region inclusive of the data erase/program area, and the buffer memory is occupied by the program/erase data during erasing/programming. According to this embodiment, the 4K byte buffer memory 110, for example, is prepared not for preserving (saving) the write data but for "pre-reading" the data. In other words, while data erase/program is effected for a certain chip, the next data to be erased/programmed is transferred (or pre-read) from the external system bus to the memory system. Accordingly, the capacity of the buffer memory 110 needs by only 512 bytes which are the minimum necessary bytes for sector program/erase, and a large scale memory chip is not necessary. Namely, the capacity of the buffer memory 110 may be an integer times 512 bytes. Alternately, it is possible to provide an area for pre-reading the data in an area of the conventional buffer memory, and to use the buffer memory as a buffer memory which is used for both data reading and programming operations.

Since the address bus driver 102 and address decoder 103 shown in FIG. 29 serve to pre-read and store therein address signals for data to be continuously or successively erased/programmed, they latch a next or succeeding address signal so that an erase/program operation with the next or succeeding address signal is started upon completion of an erase/program operation with a current address signal. Thus, by making larger the storage capacity for the pre-reading of address signals, the number of times of the continuously successive erase/program operations can be made larger and the time during which the external system bus is released from a busy state can be made longer.

The above-mentioned operations are performed under control of the control bus controller 104 which, in response to a control signal from the external system bus, controls the data transceiver 101, address driver 102 and address decoder 103 and the memory chips CH1 to CHk.

As has already been described above, provision of the buffer memory 110 in this embodiment makes it possible to pre-read data to be programmed (namely, to continuously or successively program the memory chips) owing to the successive transference of address signals and data and the latch-storage operation, during which the external system bus is advantageously released from a busy state to be available for another task.

In the memory system including a plurality of memory chips according to the present embodiment, although each individual memory chip may not be able to go on to the next step of operation until an erase/program operation with data supplied from the 512 byte sector buffer memory is completed, even if one chip is under an erase/program operation, it is still possible to perform another erase/program operation with respect to another chip simultaneously with the first-mentioned chip, namely, a parallel erase/program operation is possible, which will result in a considerable increase of an erase/program operation speed of the overall memory system to advantage.

The description given above illustrates the structures of the system using the nonvolatile semiconductor device (flash memory chip) according to the present invention. In the file applications in general, erase/program using 512 bytes as one sector is executed. Therefore, the erase/program time using the system structure of the present invention can be made shorter than the conventional structures. The program data for one sector necessary for erase/program (re-write) of the data can be saved in the chip, and erase/program can be executed without adding the buffer memory for this purpose to the system. Accordingly, the occupying area as well as the cost can be reduced. Incidentally, if the capacity of the buffer memory is 4 KB for the memory having the erase size of 4 KB in the conventional structure, pre-read cannot of course be made because all the buffer memories are used for temporary storage of the data.

In the nonvolatile semiconductor memory having the electric programmable/erasable function, the present invention effects both of the programming and erasing functions by utilizing the tunneling mechanism between the floating gate electrode and the diffusion layer of each of the drain/source/substrate. Accordingly, power consumption can be limited to about 10 nA per bit in both of the programming and erasing operations. In other words, a voltage booster having small current drivability can be used, and a voltage booster necessary for generating a high voltage required for programming and erasing and a voltage reducer can be formed inside the chip. Accordingly, program/erase/read by a single 3.3 V power source can be attained using a high speed involatile semiconductor memory.

Further, all the memory cells connected to one word line can be erased at the time of erase by applying a high voltage (12 V) to only one of the word lines and grounding all the other word lines. Accordingly, when a plurality of memory cells are connected in parallel with one word line, a plurality of memory cells can be erased simultaneously (sector erase) by defining such a word line as one sector. The memory cells on a plurality of word lines can be collectively erased by selecting a plurality of word lines.

In the programming operation, the data can be written simultaneously into a plurality of memory cells on one word line using the latch circuit as described above. For this reason, programming in the sector unit can be made by defining one word line as one sector in the same way as in the case of erase. In other words, since the erase unit and the programming unit can be made identical with each other, the operations such as save of data, etc., become unnecessary at the time of erase/program of the data.

In the programming operation, when the threshold voltage of the memory cell reaches a predetermined low threshold voltage, the voltage of the latch circuit 33 becomes 0 V. In the subsequent programming operation, therefore, the voltage of the drain diffusion layer 7 becomes 0 V and the tunneling mechanism of the electrons does not occur. Accordingly, even when a large number of bits are simultaneously programmed, variance of the low threshold voltage can be suppressed.

The select word line is set to the voltage $V_{cc}$ and the non-selected word lines are grounded Therefore, the memory cells under the programming condition are turned ON and the current flows, but the memory cells out of the programming condition are turned OFF and the current does not flow. For this reason, the ON/OFF state of the memory cells can be obtained by observing the current or voltage flowing through the data line by the use of the sense amplifier connected to the data line.

As described above, the programming and erasing operations can be accomplished by the tunneling mechanism between the diffusion layer and the floating gate inside the channel region of the memory cell. Accordingly, the area of the tunnel region can be reduced, and the memory cell area can be further miniaturized. In other words, the cell area equal to, or smaller than, that of the conventional NOR type flash memory cell can be accomplished.

The negative voltage is used for the word line at the time of programming of data and the drain voltage at this time can be reduced near to the power source voltage (3.3 V, for example). Accordingly, peripheral circuits on the data line side such as the decoder system need not have a high withstand voltage, so that the area of the peripheral circuits can be reduced. Furthermore, the occurrence of the electron-hole pairs at the drain terminal at the time of data program/erase as well as the degradation of the gate oxide film at the channel portion can be prevented, and the drop of current drivability can be prevented even after the number of times of program/erase of $10^6$ times. Since the disturbance prevention voltage to be applied to the non-selected word lines at the time of programming can be set to 3.3 V as the high voltage side power source, the booster power source need not be employed, and the write time can therefore be reduced.

Furthermore, one contact hole region is formed for a group comprising a plurality (16 to 128) of memory cells as one unit, the occupying area of the contact holes in the memory cell array can be reduced and further miniaturization of the memory cells becomes possible, so that a large capacity nonvolatile memory such as a 64 M or 256 M memory can be accomplished.

The large-scale nonvolatile semiconductor memory chip fabricated in accordance with the present invention makes it possible to accomplish a large capacity file system and a file card used for small portable appliances, to constitute a data preservation file system for an electronic still camera for processing large quantities of image data, and further to produce a card type portable recorder/reproducer for high quality music.

The technology described above makes it now possible to employ the circuit scheme shown in FIG. 2. Accordingly, a 64 m or 256 m large capacity nonvolatile memory can now be accomplished by reducing the numbers of contact holes and reducing the effective memory cell area in addition to the use of the miniaturized memory cells.

What is claimed is:

1. A nonvolatile memory system comprising:
   a nonvolatile memory including a plurality of nonvolatile memory cells and a buffer memory; and
   a control device coupled to said nonvolatile memory,
   wherein said control device is enabled to receive data from outside said nonvolatile memory system and to apply said data to said nonvolatile memory,
   wherein said nonvolatile memory is enabled to operate at least a program operation and an erase operation,
   wherein in said program operation, said nonvolatile memory receives said data from said control device, stores said data to said buffer memory and stores said data in said buffer memory to ones of said nonvolatile memory cells,
   wherein in said erase operation, said nonvolatile memory erases data stored in ones of said nonvolatile memory cells,
   wherein said control device is enabled to receive data from outside of said nonvolatile memory system, while said nonvolatile memory is operating in said erase operation, and
   wherein said buffer memory has a data storing capacity enabling the receiving of a unit of data of a length equal to the data length of said data to be stored at one time of said program operation, said data length being more than 1 byte.

2. A nonvolatile memory system according to claim 1, wherein said nonvolatile memory is enabled to receive said data received by said control device and to start storing the received data to said buffer memory, while said nonvolatile memory is operating in said erase operation.

3. A nonvolatile memory system according to claim 2, wherein said nonvolatile memory includes a plurality of word liens and a plurality of data lines, and
   wherein each of said nonvolatile memory cells is arranged at a crossing point of a corresponding one of said word lines and a corresponding one of said data lines and is coupled to the corresponding word line and corresponding data line.

4. A nonvolatile memory system according to claim 3, wherein said nonvolatile memory includes a plurality of sectors each comprising one word line and ones of the nonvolatile memory cells coupled thereto, and said buffer memory has a data storing capacity enabling the receiving of a unit of data of a length equal to the data storing capacity and enabling the storing of a unit of data in said sector.

5. A nonvolatile memory system according to claim 4, wherein each of said nonvolatile memories is a flash memory.

6. A nonvolatile memory system according to claim 1, wherein said nonvolatile memory constitutes a first nonvolatile memory in said system which comprises a plurality of said nonvolatile memory, and wherein a second said nonvolatile memory is enabled to receive said data received by said control device and to start said program operation, while said first nonvolatile memory is operating in said erase operation.

7. A nonvolatile memory system according to claim 6, wherein each of the nonvolatile memories further includes a plurality of word lines and a plurality of data lines, and wherein each of said nonvolatile memory cells in each of said nonvolatile memories is arranged at a crossing point of a corresponding one of said word lines and a corresponding one of said data lines and is coupled to the corresponding word line and corresponding data line.

8. A nonvolatile memory system according to claim 7, wherein each of said nonvolatile memories includes a plurality of sectors each comprising one word line and ones of the nonvolatile memory cells coupled thereto, and wherein said buffer memory has a data storing capacity enabling the receiving of a unit of data of a length equal to the data storing capacity and enabling the storing of a unit of data in said sector.

9. A nonvolatile memory system according to claim 8, wherein each of said nonvolatile memories is a flash memory.

10. A nonvolatile memory system according to claim 9, wherein said control device includes a host interface comprised of a data bus transceiver, an address bus driver, an address decoder and a control bus driver, an address decoder and a control bus controller, to enable communication between the nonvolatile memories and an external system bus.

11. A nonvolatile memory system according to claim 6, comprising:

wherein said control device includes a host interface comprised of a data bus transceiver, an address bus driver, an address decoder and a control bus driver, an address decoder and a control bus controller, to enable communication between the nonvolatile memories and an external system bus.

12. A nonvolatile memory system according to claim 1, wherein said nonvolatile memory includes a plurality of word lines and a plurality of data lines, and wherein each of said nonvolatile memory cells is arranged at a crossing point of a corresponding one of said word lines and a corresponding one of said data lines and is coupled to said corresponding word line and corresponding data line.

13. A nonvolatile memory system according to claim 12, wherein said nonvolatile memory includes a plurality of sectors each comprising one word line and ones of the nonvolatile memory cells coupled thereto, and wherein said buffer memory has a data storing capacity enabling the receiving of a unit of data of a length equal to the data storing capacity and enabling the storing of a unit of data in said sector.

14. A nonvolatile memory system according to claim 13, wherein said nonvolatile memory is a flash memory.

15. A nonvolatile memory system according to claim 1, wherein said control device includes a host interface comprised of a data bus transceiver, an address bus driver, an address decoder and a control bus driver, an address decoder and a control bus controller, to enable communication between the nonvolatile memory and an external system bus.

16. A nonvolatile memory system comprising:

a plurality of nonvolatile memories, each including a plurality of nonvolatile memory cells and a buffer memory; and a control device coupled to said nonvolatile memories, wherein said control device is enabled to receive data from outside said nonvolatile memory system and to apply said data to said nonvolatile memories, wherein said nonvolatile memories are enabled to operate at least a program operation and an erase operation, wherein in said program operation, each of said nonvolatile memories selectively receives said data from said control device, stores said data to said buffer memory thereof and stores said data in said buffer memory to ones of said nonvolatile memory cells of that nonvolatile memory, wherein in said erase operation, each of said nonvolatile memories selectively erases data stored in ones of said nonvolatile memory cells thereof, wherein said control device is enabled to receive data from outside of said nonvolatile memory system, while said nonvolatile memories are operating in said erase operation, and wherein said buffer memory has a data storing capacity enabling the receiving of a unit of data of a length equal to the data length of said data to be stored at one time of said program operation, said data length being more than 1 byte.

17. A nonvolatile memory system according to claim 16, wherein a second one of said nonvolatile memories is enabled to receive said data received by said control device and to start said program operation, while a first one of said nonvolatile memories is operating in said erase operation.

18. A nonvolatile memory system according to claim 17, wherein each of said nonvolatile memories further includes a plurality of word lines and a plurality of data lines, and wherein each of said nonvolatile memory cells is arranged at a crossing point of a corresponding one of said word lines and a corresponding one of said data lines and is coupled to the corresponding word line and corresponding data line.

19. A nonvolatile memory system according to claim 17, wherein each of said nonvolatile memories includes a plurality of sectors each comprising one word line and ones of the nonvolatile memory cells coupled thereto, and wherein said buffer memory has a data storing capacity for receiving data in units of a sector and enabling the storing of a unit of data in said sector.

20. A nonvolatile memory system according to claim 19, wherein each of said nonvolatile memories is a flash memory.

21. A nonvolatile memory system according to claim 20, wherein said control device includes a host interface comprised of a data bus transceiver, an address bus driver, an address decoder and a control bus controller, to enable communication between the nonvolatile memories and an external system bus.

22. A nonvolatile memory system according to claim 16, wherein said control device includes a host interface comprised of a data bus transceiver, an address bus driver, an address decoder and a control bus controller, to enable communication between the nonvolatile memories and an external system bus.

* * * * *